(12) United States Patent
Shibusawa

(10) Patent No.: US 9,469,097 B2
(45) Date of Patent: *Oct. 18, 2016

(54) STRUCTURE INCLUDING THIN PRIMER FILM AND METHOD OF PRODUCING SAID STRUCTURE

(75) Inventor: Kunihiko Shibusawa, Takasaki (JP)

(73) Assignee: TAIYO YUDEN CHEMICAL TECHNOLOGY CO., LTD., Takasaki-Shi, Gunma (JP)

( * ) Notice: Subject to any disclaimer, the term of this patent is extended or adjusted under 35 U.S.C. 154(b) by 82 days.

This patent is subject to a terminal disclaimer.

(21) Appl. No.: 14/237,830

(22) PCT Filed: Aug. 10, 2012

(86) PCT No.: PCT/JP2012/070529
§ 371 (c)(1),
(2), (4) Date: Mar. 7, 2014

(87) PCT Pub. No.: WO2013/022097
PCT Pub. Date: Feb. 14, 2013

(65) Prior Publication Data
US 2014/0208968 A1    Jul. 31, 2014

(30) Foreign Application Priority Data

Aug. 10, 2011 (JP) ................................. 2011-174908
Feb. 14, 2012 (JP) ................................. 2012-029090

(51) Int. Cl.
*B41F 15/34* (2006.01)
*B41N 1/24* (2006.01)
(Continued)

(52) U.S. Cl.
CPC ............. *B41F 15/34* (2013.01); *B41N 1/247* (2013.01); *C23C 14/04* (2013.01); *C23C 14/0605* (2013.01); *C23C 14/0641* (2013.01); *C23C 14/081* (2013.01); *C23C 14/5846* (2013.01);
(Continued)

(58) Field of Classification Search
None
See application file for complete search history.

(56) References Cited

U.S. PATENT DOCUMENTS 4,110,114 A * 8/1978 Sato .......................... G03F 1/54
                                                        204/192.26
4,803,100 A    2/1989 Ameen et al.
(Continued)

FOREIGN PATENT DOCUMENTS

EP    0 267 359    5/1988
JP    63-77787 A    4/1988
(Continued)

OTHER PUBLICATIONS

Chinese Office Action dated Jan. 30, 2015 for Appnl. No. 201280038856,7.
(Continued)

*Primary Examiner* — Blake A Tankersley
*Assistant Examiner* — Michael Robinson
(74) *Attorney, Agent, or Firm* — Pillsbury Winthrop Shaw Pittman, LLP

(57) ABSTRACT

One object is to provide a structure including a thin primer film formed by a dry process and tightly bound to a fluorine-containing silane coupling agent. In accordance with one aspect, a structure according to an embodiment of the present disclosure includes: a substrate; and a thin primer film containing at least one substance selected from the group consisting of silicon, titanium, aluminum, aluminum oxide, and zirconium and formed on a surface of the substrate by a dry process.

19 Claims, 11 Drawing Sheets

(51) Int. Cl.
*C23C 14/06* (2006.01)
*C23C 14/58* (2006.01)
*C23C 16/34* (2006.01)
*C23C 16/40* (2006.01)
*C23C 16/42* (2006.01)
*C23C 16/517* (2006.01)
*C23C 16/56* (2006.01)
*C23C 28/04* (2006.01)
*C23C 14/08* (2006.01)
*C23C 14/04* (2006.01)

(52) U.S. Cl.
CPC ............ *C23C 16/34* (2013.01); *C23C 16/401* (2013.01); *C23C 16/405* (2013.01); *C23C 16/42* (2013.01); *C23C 16/517* (2013.01); *C23C 16/56* (2013.01); *C23C 28/042* (2013.01); *Y10T 428/24802* (2015.01); *Y10T 428/24917* (2015.01); *Y10T 428/24999* (2015.04); *Y10T 442/10* (2015.04)

(56) References Cited

U.S. PATENT DOCUMENTS

| | | | |
|---|---|---|---|
| 4,803,110 A | 2/1989 | Ahn et al. | |
| 4,806,220 A | 2/1989 | Finley | |
| 4,898,790 A | 2/1990 | Finley | |
| 5,028,759 A | 7/1991 | Finley | |
| 5,059,295 A | 10/1991 | Finley | |
| 5,270,517 A | 12/1993 | Finley | |
| 5,939,172 A * | 8/1999 | Snakenborg et al. | 428/156 |
| 2003/0151079 A1* | 8/2003 | Jones et al. | 257/295 |
| 2004/0126563 A1* | 7/2004 | Adams et al. | 428/317.9 |
| 2005/0138803 A1* | 6/2005 | Okawa et al. | 29/846 |
| 2007/0238311 A1 | 10/2007 | Levy | |

FOREIGN PATENT DOCUMENTS

| | | |
|---|---|---|
| JP | 9-315024 A | 12/1997 |
| JP | 11-348172 A | 12/1999 |
| JP | 2000-192227 A | 7/2000 |
| JP | 2002-067267 | 3/2002 |
| JP | 2003-19874 A | 1/2003 |
| JP | 2003-19875 A | 1/2003 |
| JP | 2005-144973 | 6/2005 |
| JP | 2006347062 A | 12/2006 |
| JP | 2009045867 A | 3/2009 |
| JP | 2010-137543 A | 6/2010 |
| JP | 2010-191144 A | 9/2010 |
| WO | 2008/133263 A1 | 11/2008 |

OTHER PUBLICATIONS

European Search Report dated Mar. 2, 2015 for Appl. No. 12821458.2.
Korean Office Action dated Mar. 26, 2015 for Appln. No. 10-2013-7029854.
Taiwanese Office Action dated Apr. 20, 2015 for Appln. No. 101129150.
International Search Report dated Oct. 23, 2012 of PCT/JP2012/070529 filed Aug. 10, 2012 (4 pages including translation).
Chinese Office Action dated Dec. 4, 2015 for Appln. No. 201280038856.7.
Korean Office Action dated Nov. 30, 2015 for Appln. No. 10-2013-7029854.
Korean Rejection Decision dated Feb. 25, 2016 for Appln. No. 10-2013-7029854.
Korean decision to Dismiss Amendment dated Feb. 25, 2016 for Appln. No. 10-2013-7029854.
Japanese Office Action dated Aug. 2, 2016 for Appln. No. 2013-528084.

* cited by examiner

STRUCTURE INCLUDING THIN PRIMER FILM AND METHOD OF PRODUCING SAID STRUCTURE

CROSS-REFERENCE TO RELATED APPLICATIONS

This application is a U.S. National Stage application under 35 USC §371 of PCT/JP2012/070529 filed 10 Aug. 2012, which claims priority under the Paris Convention to Japanese Application No. 2011-174908 filed 10 Aug. 2011 and Japanese Application No. 2012-029090 filed 14 Feb. 2012, the entire contents of each of these applications being incorporated herein by reference.

TECHNICAL FIELD

Background

There are known surface modification processes in which coating is applied to a surface of a substrate with silane coupling agent containing fluorine so as to provide the surface of the substrate with oil repellence. For example, in some studies, a fluorine coating layer composed of fluorine-containing silane coupling agent is formed on a surface of a screen printing mesh to provide the mesh with oil repellence and enhance demoldability of printing paste. In many cases, fluorine-containing silane coupling agent is not applied directly on a mesh body but applied on a thin primer film as an intermediate, so as to ensure the fixity of the agent on the mesh. For example, there are known methods in which the mesh body is coated with a liquid primer and then fluorine-containing silane coupling agent is applied onto the liquid primer (see Japanese Patent Application Publication Nos. 2006-347062 and 2009-45867). Additionally, there are known techniques for electronic component conveyors, wherein a porous sheet provided on an adsorbing port of an adsorbing collet is coated with fluorine-containing silane coupling agent so as to prevent electronic components being conveyed from being adhered to the porous sheet. Such a porous sheet is coated with fluorine-containing silane coupling agent via a liquid primer.

RELEVANT REFERENCES

List of Relevant Patent Literature

Patent Literature 1: Japanese Patent Application Publication No. 2006-347062
Patent Literature 2: Japanese Patent Application Publication No. 2009-45867

SUMMARY

Unfortunately, a liquid primer tends to spread into an opening in a work such as a mesh and a porous sheet and clog the opening. Particularly, a liquid primer used on a screen printing mesh may clog printing pattern openings and prevent accurate application of printing paste in accordance with a printing pattern.

To overcome this problem, a thin primer film may be formed on a substrate in place of the liquid primer by a dry process such as the chemical vapor deposition (CVD) method. The thin primer film may be, for example, an amorphous carbon film composed of an amorphous carbon material such as diamond-like carbon (DLC) formed by the CVD method. However, fluorine-containing silane coupling agent does not have sufficient fixity on the amorphous carbon film.

To overcome this problem, various embodiments of the present disclosure provide a structure including a thin primer film formed by a dry process and tightly bound to a fluorine-containing coupling agent. Additionally, various embodiments of the present disclosure provide a method of producing the structure.

The Inventors found a primer composition layer containing silicon (Si), titanium (Ti), aluminum (Al), aluminum oxide ($Al_2O_x$ (x may be any number)), or zirconium (Zr) tightly binds to a fluorine-containing silane coupling agent. In this primer layer, a hydroxyl group originating from silicon (Si), titanium (Ti), aluminum (Al), aluminum oxide ($Al_2O_x$), zirconium (Zr), or an oxide of these substances forms a covalent bond due to a dehydration condensation reaction, a hydrogen bond, and/or another bond, with a functional group of the fluorine-containing silane coupling agent; therefore, it is presumed that the primer layer and the fluorine-containing silane coupling agent are bound tightly. Herein, the term "primer layer" is used exchangeably with the term "thin primer film."

A primer composition according to an embodiment of the present disclosure contains at least one of silicon, titanium, aluminum, aluminum oxide, and zirconium and is formed on a surface of a substrate by a dry process.

A structure according to an embodiment of the present disclosure comprises: a substrate; and a thin primer film containing at least one of silicon, titanium, aluminum, aluminum oxide, and zirconium and formed on a surface of the substrate by a dry process.

In an embodiment of the present disclosure, the primer composition containing at least one of silicon, titanium, aluminum, aluminum oxide, and zirconium is formed either directly on the substrate or indirectly on the substrate via an intermediate layer.

A method of producing the structure according to an embodiment of the present disclosure comprises the steps of: preparing a substrate; and forming a thin film containing at least one of silicon, titanium, aluminum, aluminum oxide, and zirconium directly or indirectly on the substrate by a dry process.

Various embodiments of the present disclosure provide a structure including a thin primer film formed by a dry process and tightly bound to a fluorine-containing silane coupling agent. Additionally, various embodiments of the present disclosure provide a method of producing the structure.

DESCRIPTION OF EXAMPLE EMBODIMENTS

Figure 1:
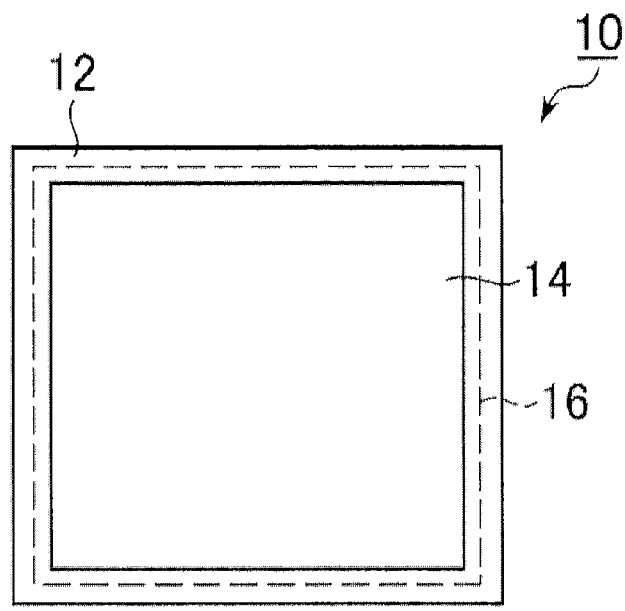
FIG. 1 is a schematic plan view illustrating the general configuration of a screen printing plate including a mesh according to an embodiment of the present disclosure.

Various embodiments of the present disclosure will now be described with reference to the attached drawings. In the drawings, the same or similar components are denoted by the same or similar reference signs, and the detailed description of the same or similar components is appropriately omitted.

Figure 2:
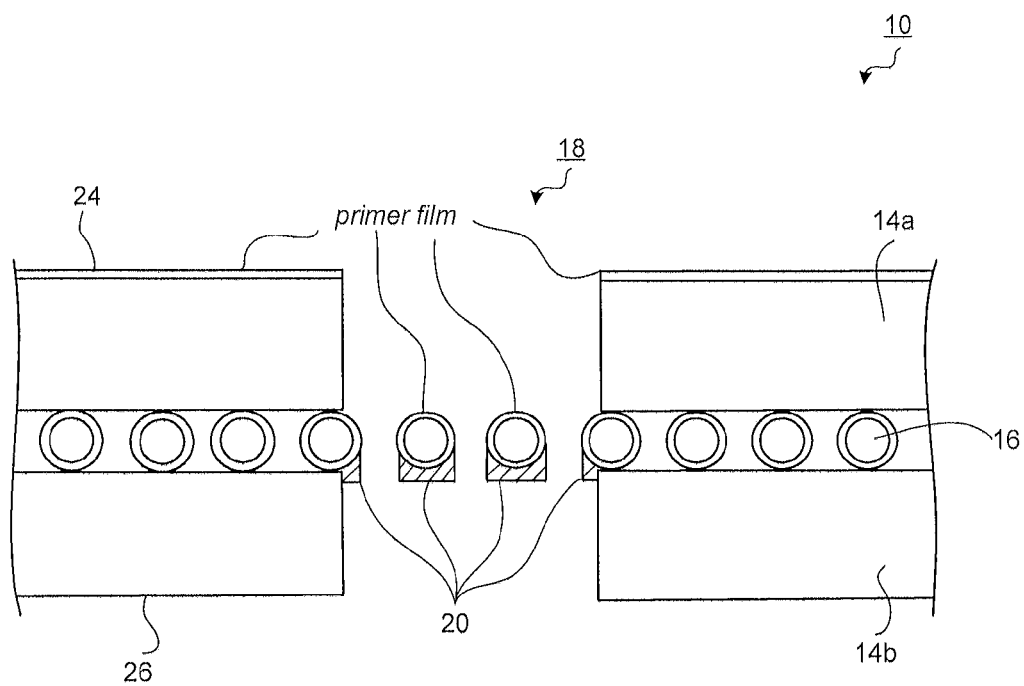
FIG. 2 is a schematic cross-sectional view illustrating the screen printing plate including a mesh according to an embodiment of the present disclosure.

A thin primer film according to an embodiment of the present disclosure contains at least one of silicon, titanium, aluminum, aluminum oxide, and zirconium and is formed on a surface of a substrate by a dry process. The thin primer film may be used as a primer layer for fixing a fluorine-containing silane coupling agent on various structures. For example, the thin primer film according to an embodiment of the present disclosure may be used in the form of a primer layer when a fluorine-containing silane coupling agent is applied on a screen printing mesh. FIG. 1 is a schematic plan view illustrating the general configuration of a screen printing plate, and FIG. 2 is a schematic cross-sectional view illustrating the screen printing plate according to an embodiment of the present disclosure. On the screen printing plate is formed a thin primer film according to an embodiment of the present disclosure. FIGS. 1 and 2 each schematically illustrate the configuration of the screen printing plate according to an embodiment of the present disclosure, and it should be noted that dimensional relationship is not accurately reflected in the drawings. The primer layer in the present disclosure may also be formed in an opening in a stencil printing plate or a porous sheet not having a screen mesh.

As shown, the screen printing plate 10 may comprise a frame 12 and a mesh 16 attached to the frame 12. The frame 12 may be composed of cast iron, stainless steel, or aluminum alloy. The mesh 16 may be composed of a resin such as polyester or stainless steel (SUS304). The mesh 16 may be entirely or partially coated with an emulsion 14.

The mesh 16 according to an embodiment of the present disclosure may be fabricated by weaving threads of various materials and diameters. The surface roughness, sectional shape, and weaving method of the threads constituting the mesh 16 may be appropriately varied in accordance with the applications. The sectional shapes may include, for example, circular, oval, rectangular, polygonal, irregular, and star shapes. Examples of weaving method may include plain weave, twill weave, and three-dimensional weave. The material of the threads constituting the mesh 16 may be, for example, a metal such as stainless steel, steel, copper, titanium, or tungsten or an alloy thereof. The metal may also be an amorphous metal, etc. Further, the material of the threads constituting the mesh 16 may also be a chemical fiber such as polypropylene, polyester, polyethylene, nylon, or vinyl, a mixed fiber such as rayon, a carbon fiber, an inorganic material such as glass fiber, or a natural fiber such as wool, silk, cotton, or cellulose. For example, the mesh 16 may be a mesh #500-19. In a mesh #500-19, the wire rods (fiber threads) constituting the mesh may have a diameter of 19 μm, the mesh openings (i.e., the interval between the neighboring wire rods) may have a width of about 30 μm, and the mesh count may be 500. The mesh count of 500 may indicate that 500 mesh wire rods are present in a width of one inch. The mesh 16 may be fixed at the portions where fibers cross each other (intersections) with a plating extract, adhesive, vapor-deposited film, or sputtered film. The plating extract may be formed by, for example, electrolytic Ni plating, electrolytic Ni—Co alloy plating, or electrolytic Cr plating. In an embodiment, the intersections between the threads of the mesh may be compressed to reduce the thickness of the mesh 16 to the thickness of one thread of the mesh. The specifications of the mesh 16 are not limited to those described herein such as the substance, wire diameter, mesh count, uniformity of the size of mesh openings, positions of mesh openings, taper angle of mesh openings, and shape of the openings; these specifications may be varied in accordance with printing method, printing pattern, printing medium, and required endurance. In an embodiment, the mesh 16 may be ordinarily fabricated by weaving thread-like material but may also be fabricated by other methods. For example, the mesh 16 may be fabricated by electrotyping, printing, and photolithography. Also, the mesh 16 may be fabricated by forming through-halls in a substrate by various methods such as laser processing, etching, drilling, punching, and electric discharging. The through-halls formed in these processes may correspond to the openings of the mesh 16. The above materials and fabrication methods may be appropriately combined. Further, the edges of the openings of the mesh 16 may be appropriately chamfered. The mesh 16 may be a combination of a plurality of meshes. For example, meshes of the same type or different types may be combined together.

In an embodiment, a diazo-based photosensitive emulsion can be used as the emulsion 14. A printing pattern opening 18 may be formed in the emulsion 14 by, for example, photolithography so as to correspond to a printing pattern. The printing pattern opening 18 may be formed so as to penetrate the emulsion 14 in the thickness direction. In a photolithographic process, the emulsion 14 applied to the mesh 16 may be exposed to light in a photomask pattern to cure part of the emulsion 14, and then the other region of the emulsion 14 than the part cured by the exposure to light may be removed to leave only the cured part on the mesh 16, so that the printing pattern opening 18 is formed. The printing pattern opening 18 may be defined by inner walls 22 of the emulsion 14. Furthermore, in place of directly attaching the mesh 16 with a printing pattern to the frame 12, a support screen (not illustrated) separate from the mesh 16 may be attached to the frame 12, and then the mesh 16 may be attached to the support screen. In an embodiment, part of the support screen which overlaps the mesh 16 may be removed with a cutter knife. The printing pattern openings 18 may be formed by methods other than photolithography. For example, in the case where reproducibility of a printing pattern is not strictly required, any material that can form printing pattern openings on the screen mesh, such as clay and plaster, can be used. The mesh 16 may also be used for solid printing. When the mesh 16 is used for solid printing, the emulsion 14 may not be required.

In other embodiments, the emulsion 14 may be replaced with a printing pattern retainer shaped in a plate or foil and provided with printing pattern openings 18. The printing pattern retainer may be formed of various materials such as metals, alloys, resins, or ceramics. Examples of the metals that can be used as a material of the printing pattern retainer include steel, copper, nickel, gold, silver, zinc, aluminum, and titanium. Examples of the alloys that can be used as a material of the printing pattern retainer include aluminum alloy, titanium alloy, stainless steel alloy, binary alloy such as chrome molybdenum steel alloy, Ni—Co alloy, or Ni—W alloy, and multi-component alloy. Examples of resins that can be used as a material of the printing pattern retainer include polypropylene, polyester, polyethylene, nylon, acrylic, PET, PEN, polyimide, polyimide-amide, glass epoxy, and FRP. In addition, materials usable for printing pattern retainer include cellulose, glass, ceramic, synthetic rubber such as nitrile, and natural rubber. These materials may be combined with other materials, if necessary. The printing pattern retainer formed of these materials and shaped in a plate or foil may be affixed on the mesh 16. The printing pattern in the printing pattern retainer may be formed either before or after affixture on the mesh 16.

In an embodiment, the printing pattern retainer having printing pattern openings may be formed of, for example, a plating film extracted by electroforming. The printing pattern retainer in another embodiment may be made of a plate-like or foil-like substrate having through-holes formed by laser processing, etching, drilling, punching, electrodischarge machining, and/or other various methods.

The stencil printing plate according to an embodiment of the present disclosure may be free of the mesh 16 and may be provided with a printing pattern retainer directly on the frame 12. The stencil printing plate according to another embodiment of the present disclosure may be free of the frame 12 and may be provided with a printing pattern retainer installed on a printing machine directly or via a desired fixture. A primer layer according to an embodiment of the present disclosure contains at least one of silicon, titanium, aluminum, aluminum oxide, and zirconium and is formed on the surface of each of the threads of the mesh 16. The thin primer film is so thin that it is omitted from the drawings. In the case where the screen printing plate 10 is replaced with a stencil printing plate not having a mesh in the printing pattern openings, a thin primer film containing at least one of silicon, titanium, aluminum, aluminum oxide, and zirconium or a compound of these substances may be formed in the vicinity of, or on the inner wall of, the openings in the stencil printing plate. In an embodiment, a primer layer composed of an amorphous carbon film or a polymerized carbon film formed by a plasma-based dry process may contain at least one of silicon, titanium, aluminum, aluminum oxide, and zirconium. Such a primer layer may be tightly bound to the fluorine-containing silane coupling agent and may have improved slidability, gas barrier quality, and ductility.

The primer composition according to an embodiment of the present disclosure may be formed on the surface of the mesh 16 by various known dry processes including various plasma sputtering methods such as bipolar sputtering, tripolar sputtering, magnetron sputtering, and facing target sputtering, various ion beam sputtering methods such as ion beam sputtering and ECR sputtering, various plasma CVD methods such as direct current (DC) plasma CVD method, low-frequency plasma CVD method, radio-frequency (RF) plasma CVD method, pulsed plasma CVD method, microwave plasma CVD method, atmospheric plasma method (e.g., dielectric-barrier discharge system), and subatmospheric plasma method, various ion plating methods using plasma such as direct current (DC) ion plating method, hollow cathode discharge (HCD) method, and radio-frequency (RF) excitation method, various ion plating methods using ion beams such as ion beam deposition (IBD) method, ion beam assisted deposition (IBAD) method, and ion vapor-deposition film formation (IVD) method, and combinations of these methods. For example, in a physical vapor deposition (PVD) method using a solid Si target, Ti target, Al target, $Al_2O_3$ target, Zr target, etc., a substrate of the mesh 16 may be set on a deposition apparatus wherein a sputtering gas (e.g., an inert gas such as argon gas) may be introduced at a particular gas pressure and flow rate in a vacuum environment and the Si target, Ti target, Al target, $Al_2O_3$ target, or Zr target may be sputtered to form on the substrate a thin primer film according to an embodiment of the present disclosure. By mixing the sputtering gas with oxygen (O), nitrogen (N), or a mixture thereof, a thin primer film comprising a product of silicon, titanium, aluminum, aluminum oxide, or zirconium combined with O or N (e.g., $SiO_2$, $SiN_2$, $TiO_2$, $TiN_2$, $ZrO_2$, etc.) may be formed by a reactive sputtering method. In a chemical vapor deposition method (plasma CVD method) using a gas material, a plasma CVD apparatus having a work placed therein and evacuated with vacuum may form a primer layer containing Si or Ti by using a main material gas for Si primer layers such as silane ($SiH_4$) and tetraethoxysilane (TEOS) or a main material gas for Ti primer layers such as titanium chloride ($TiCl_4$), titanium iodide ($TiI_4$), titanium isopropoxide $Ti(i-OC_3H_7)_4$. In an embodiment, a main material gas such as trimethylaluminum ($Al(CH_3))_3$) or aluminum chloride ($AlCl_3$) may be mixed with oxygen gas or nitrogen gas as necessary to form a primer layer containing aluminum and oxygen or nitrogen. Further, a thin primer film containing at least one of silicon, titanium, aluminum, aluminum oxide, and zirconium and formed on a substrate may be exposed to oxygen plasma or nitrogen plasma such that the thin primer film may contain one or both of oxygen and nitrogen. In the embodiment as described above, the thin primer film may contain one or both of oxygen and nitrogen that provide polarity to the thin primer film. Thus, the chemical adhesion and the physical adhesion (fixity) between the thin primer film and the fluorine-containing silane coupling agent may be improved.

When the primer layer contains zirconium, the surface layer of the primer layer may be exposed to oxygen plasma, nitrogen plasma, or both oxygen and nitrogen at high energy by a plasma process, thereby to activate an oxide layer (passive layer) produced on the surface layer of the primer layer containing zirconium. Thus, when the primer layer contains zirconium, a passive layer formed on the surface layer of the primer layer may be activated without a hydrothermal process. This method can be readily applied to a stencil printing plate and a porous sheet unsuitable for surface activation by a hydrothermal process.

Further, in an embodiment wherein a thin primer layer contains one or both of oxygen and nitrogen, the thin film may have improved wettability for water, and a water-soluble emulsion (liquid emulsion) applied to a printing screen mesh may have improved wettability. This may prevent pinholes originating from bubbles produced on application of the emulsion and improve the wear resistance of the stencil printing plate as the emulsion fixity on the screen mesh is improved. After a thin primer film containing at least one of silicon, titanium, aluminum, aluminum oxide, and zirconium according to the present disclosure is formed, and another layer comprising an amorphous carbon film substantially constituted by carbon, or carbon and hydrogen is formed, oxygen may be applied by oxygen plasma while a part or all of the layer comprising the amorphous carbon film is removed by ashing with oxygen gas. Also, the main material gas may be mixed with a carrier gas such as argon, hydrogen, nitrogen, etc. as necessary. When the work on which the primer layer is to be formed by these dry processes is vulnerable to thermal deformation or damage (e.g., a stencil printing plate to which an emulsion is applied), heating of the work may be prevented by using a cooling device or significantly shortening the film formation time in the dry processes. The primer layer according to an embodiment of the present disclosure comprising at least one of silicon, titanium, aluminum, aluminum oxide, and zirconium may be formed in an amorphous state as necessary.

The primer layer according to an embodiment of the present disclosure comprising at least one of silicon, titanium, aluminum, aluminum oxide, and zirconium may be formed by a high straightness plasma (process) and thus have less tendency to spread onto irrelevant portions such as the bottom surface of the substrate than do liquid primers. Therefore, in an embodiment of the present disclosure, the primer layer can be formed selectively on a desired surface of the substrate (e.g., a printing surface of a stencil to be provided with water and oil repellence), and can be formed selectively on a particular portion on the substrate by masking. For a screen printing mesh #500 having thin wire rods with a diameter of about 20 μm for example, a high straightness plasma process can form a primer layer selectively on the side of the wire rods of the mesh that can be reached by the plasma. Such a process can prevent spreading of the primer layer onto the back of the wire rods of the mesh to form the primer layer selectively on the desired side. For a stencil printing plate, when the surface for loading a printing paste (squeegee surface) is provided with water repellence and oil repellence, the loadability of the printing paste and rollability of the paste by the squeegee (control of viscoelasticity of the paste) may be inhibited to cause defects such as blurred printing; in contrast, when a primer layer is formed by a high straightness plasma process, the primer layer can be formed selectively on the side opposite to the squeegee surface to avoid such defects.

In an embodiment, on the squeegee surface may be formed an amorphous carbon film substantially comprising carbon only and/or a conventional amorphous carbon film substantially comprising hydrogen and carbon only. Such a conventional amorphous carbon film may have less tendency to bind to a fluorine-containing silane coupling agent because of its inert surface. Accordingly, a coupling agent such as a fluorine-containing silane coupling agent adhered to the squeegee surface can be readily removed. The conventional amorphous carbon film having an inert surface may be formed on a desired region where a water-repellent layer or a water- and oil-repellent layer should preferably not formed, as well as on the squeegee surface.

Further, the printing screen mesh may include convex portions where wires of the mesh lie one over another and concave portions, as well as fine irregularity in the surface of the mesh; when a primer layer is formed by a plasma dry process using an electric field, the primer layer may be formed first on the convex portions where the electric field is focused and then on the concave portions. Therefore, the coverage on the mesh by the primer layer (the proportion of the region where the primer layer is formed in the surface area of the mesh) can be finely controlled by controlling the formation time and/or optimizing the positions of the masking shield, work, and/or electrodes in the electric field.

Additionally, in an embodiment of the present disclosure, when a thin primer film containing at least one of silicon, titanium, aluminum, aluminum oxide, and zirconium and having adhesion and ductility is formed on a printing screen mesh, the intersection points between wires constituting the screen may be fixed by adhesion to improve the durability of the screen mesh and prevent the deformation.

The thin primer film layer according to the present disclosure may be either formed on the mesh 16 before the emulsion 14 is applied to the mesh 16 or formed on the exposed portion of the mesh 16 exposed in the printing pattern openings after the emulsion 14 is applied. In another embodiment, the thin primer film layer according to the present disclosure may be formed, along with or in place of the emulsion 14, on the exposed portion of the plate-like or foil-like printing pattern retainer exposed in its printing pattern openings 18 after the mesh 16 is placed on the frame 12. In still another embodiment, a primer composition according to the present disclosure, and/or a water-repellent layer and/or a water- and oil-repellent layer may be formed, in place of the emulsion 14, on the plate-like or foil-like printing pattern retainer having the printing pattern openings 18 formed therein. Additionally, various necessary intermediate layers may be formed between the mesh 16 and the thin primer film layer according to the present disclosure, unless diverged from the purport of the present disclosure.

At the edges of the emulsion formed on the mesh 16 encompassing the printing pattern openings 18, part of the openings in the mesh 16 may be filled with the emulsion; therefore, the printing paste is not transferred well. To overcome this problem, the thin primer film layer of the present disclosure may be formed on the emulsion 14, as well as on the exposed portion of the mesh 16 exposed in the printing pattern opening 18; and a water-repellent layer and/or a water- and oil-repellent layer may be formed on the thin primer film layer. Thus, the transferability of the printing paste may be further improved.

A high-energy light beam used for emulsion exposure such as UV light may be applied to the portions encompassing the printing pattern openings 18 in the photosensitive emulsion 14 applied on the mesh 16. In this case, the exposure light may oxidize the thin primer film of the present disclosure formed on the surface of the mesh 16 (surface activation). Thus, the silane coupling agent may be tightly fixed on the surface of the mesh 16.

A thin coating film 20 including, for example, a fluorine-containing silane coupling agent may be formed on at least part of the thin primer film formed as described above on the surface of the mesh 16. Such a fluorine-containing silane coupling agent may be "FG-5010Z130-0.2" manufactured by Fluoro Technology Corporation. In an embodiment, the thin coating film 20 may be formed so thin as to have substantially no impact on the volume of printing paste which passes through the printing pattern openings 18; for example, the thickness may be approximately 20 nm. The thickness of the thin coating film 20 is not limited thereto and can be appropriately changed depending on types of fluorine-containing silane coupling agent used; for instance, the thickness may range from 1 nm to 1 μm.

The thin coating film 20 formed of the fluorine-containing silane coupling agent may be formed on the thin primer film by various methods. For example, the thin coating film 20 may be applied onto the mesh 16 having formed thereon a thin primer film by using fabrics such as unwoven fabrics, a sponge, a sponge-like roller, a brush, and/or other various application tools. Also, the thin coating film 20 may be formed by spraying the fluorine-containing silane coupling agent. The thin coating film 20 may be formed by other various methods including dipping, resistance heating, evaporation, and/or other various methods.

If a thin coating film comprising the fluorine-containing silane coupling agent is formed on a printing screen mesh before the screen mesh is fastened on the stencil printing plate, the adhesion between the components of the stencil such as emulsion and the screen mesh may be degraded. Alternatively, the screen mesh having formed thereon a primer layer only may be adhered to the components of the stencil before a thin coating film is formed, and then the coating film comprising the fluorine-containing silane coupling agent may be formed on the portions of the screen mesh adhered to the stencil that require water repellence and oil repellence.

The silane coupling agent chemically binds to at least one of silicon, titanium, aluminum, aluminum oxide, and zirconium, or a hydroxyl group originating from an oxide of these elements (e.g., by a bond due to a dehydration condensation reaction or a hydrogen bond). Therefore, a continuous planar fluorine resin film including a tight binding bridge layer may be formed on the surface of the primer layer.

Additionally, through the above reactive sputtering method or application of oxygen plasma or nitrogen plasma, the thin primer film may contain oxygen or nitrogen that may produce electrical polarity. This electrical polarity may produce a bond between the thin primer film and the fluorine-containing silane coupling agent based on the polarity, and this bond may also tightly fix the fluorine-containing silane coupling agent on the thin primer film.

The thin primer film and the coating film formed as above may be as thin as several tens of nanometers and thus may be applicable to a mesh and stencil printing plate having fine structures. That is, even if the thin primer film and the coating film according to an embodiment of the present disclosure is adhered to a fine printing pattern opening of the mesh or the stencil printing plate, there may be almost no change in the shape of the printing pattern opening, and thus accuracy in printing may not be degraded.

An embodiment of the present disclosure may include a desired fluorine-containing coupling agent or a fluorine coating agent that can bind, by a dehydration condensation reaction, to a hydroxyl group originating from at least one of silicon, titanium, aluminum, aluminum oxide, and zirconium in the primer layer. For example, the fluorine-containing coupling agent in an embodiment may include an element M that can form —O-M bonds with a substrate (M is Ti, Al, or Zr). Further, when a fluorine-silicon compound such as a liquid coupling agent is introduced in a vacuum apparatus, a fluorine-containing layer comprising the fluorine-silicon compound and having water and oil repellence may be formed on the primer layer of the present disclosure by, e.g., resistance heating, a sort of vacuum evaporation method.

The fluorine-containing coupling agent may refer to a coupling agent exhibiting water repellence and oil repellence and including a substituent group of fluorine in the molecular structure thereof. The fluorine-containing coupling agents that can be used for the thin film 20 may include the following.

(i) CF3(CF2)7 CH2 CH2 Si(OCH3)3
(ii) CF3(CF2)7 CH2 CH2 SiCH3 Cl2
(iii) CF3(CF2)7 CH2 CH2 SiCH3(OCH3)2
(iv) (CH3)3 SiOSO2 CF3
(v) CF3 CON(CH3)SiCH3
(vi) CF3 CH2 CH2 Si(OCH3)3
(vii) CF3 CH2 SiCl3
(viii) CF3(CF2)5 CH2 CH2 SiCl3
(ix) CF3(CF2)5 CH2 CH2 Si(OCH3)3
(x) CF3(CF2)7 CH2 CH2 SiCl3

These fluorine-containing coupling agents are non-limiting examples of fluorine-containing coupling agents applicable to the present disclosure. The applicable fluorine-containing coupling agents may include, for example, FG-5010Z130-0.2 (containing 0.02-0.2% fluorine resin and 99.8-99.98% fluorine-based solvent) from Fluoro Technology Corporation.

The thin coating film 20 may have two-layer structure including a first layer composed mainly of a coupling agent and a second layer composed mainly of a water repellent material or a water- and oil-repellent material. The first layer may be a thin film composed of, for example, a coupling agent that can form, with the primer layer, hydrogen bonds and/or —O-M bonds (M is any one element selected from the group consisting of Si, Ti, Al, and Zr) by condensation reaction, on the primer layer of the present disclosure on the surface of the mesh 16. Such coupling agents may include, for example, silane coupling agent, titanate-based coupling agent, aluminate-based coupling agent, and zirconate-based coupling agent. These coupling agents may be used combinedly with other coupling agents. The second layer may be a thin film composed of a water repellent material, for example, alkylchlorosilanes such as methyltrichlorosilane, octyltrichlorosilane, and dimethyldichlorosilane, alkylmethoxysilanes such as dimethyldimethoxysilane and octyltrimethoxysilane, hexamethyldisilazane, a silylation agent, and silicone. Also, the thin film composed of the above fluorine-containing silane coupling agent may be used as the second layer. The water repellent materials or water- and oil-repellent materials that can be used as the second layer are not limited to those explicitly described herein. The material of the thin film 20 may be appropriately selected in view of various printing conditions such as the opening width and wire diameter of the used mesh and/or the size of the printing pattern openings in the stencil printing plate, the compositions of the printing paste and ink (water-based or oil-based, the particle size of the contents such as a pigment), viscosity, thixotropy, and the temperature and humidity in printing.

Silane coupling agents are widely used; and this requires no example to be cited. Various silane coupling agents commercially available can be used as the first layer of the thin film 20. One example of the silane coupling agent applicable to the present disclosure is decyltrimethoxysilane ("KBM-3103" from Shin-Etsu Chemical Co., Ltd.).

The titanate-based coupling agents contained in the thin coating film 20 may include, for example, tetramethoxy titanate, tetraethoxy titanate, tetrapropoxy titanate, and tetraisopropoxy titanate. For example, "Plenact 38S" (from Ajinomoto Fine-Techno Co., Inc.) is commercially available.

The aluminate-based coupling agents contained in the thin coating film 20 may include aluminum alkyl acetoacetate diisopropylate, aluminum ethyl acetoacetate diisopropylate, aluminum tris(ethyl acetoacetate), and aluminum isopropylate. For example, "Plenact AL-M" (alkyl acetate aluminum diisopropylate from Ajinomoto Fine-Techno Co., Inc.) is commercially available.

The zirconia-based coupling agents contained in the thin film 20 may include neopentyl(diaryl)oxy, trimethacryl zirconate, tetra(2,2 diaryloxy methyl)butyl, di(ditridecyl)phosphate zirconate, and cyclo[dineopentyl(diaryl)]pyrophosphate dineopentyl(diaryl)zirconate. For example, "Ken-React NZ01" (from Kenrich Petrochemicals, Inc.) is commercially available.

Further, as compared to, e.g., an amorphous carbon film primer layer comprising carbon, the thin primer film containing Si or Ti according to an embodiment of the present disclosure may have less tendency to diffuse from the surface layer of the substrate comprising Ni, Co, Fe, etc. into the substrate and thus can be formed on the substrate comprising these elements with excellent fixity. In many cases, the elements Ni, Co, Fe, etc. are present in the following: the mesh 16 made of a stainless steel which is an alloy of Fe, Ni, and Cr; an Ni plating film or an Ni—Co alloy plating film formed on the surface layer of the mesh 16 made of the stainless steel to fix the intersection points and thus prevent deformation of the mesh 16; or a substrate used to form the mesh 16 itself of films deposited by Ni plating or Ni—Co alloy plating in electroforming.

In the embodiment of the present disclosure as described above, a fluorine-containing silane coupling agent may be applied onto a thin primer film formed by a dry process and containing at least one of silicon, titanium, aluminum, aluminum oxide, and zirconium; therefore, clogging of fine openings in the mesh 16 may be inhibited as compared to conventional techniques wherein a liquid primer is applied onto the mesh 16. Additionally, when a liquid primer is applied, the thickness of the primer layer may be uneven because of spreading of the liquid primer to irrelevant portions, gravity, uneven surface tension distribution on the surface of the substrate. In contrast, in an embodiment of the present disclosure, the primer layer may be formed by a dry process; therefore, the thickness of the primer layer can be relatively even. The thin primer film thus formed may tightly bind to, e.g., a fluorine-containing silane coupling agent therefore, the fluorine-containing silane coupling agent may be applied with excellent fixity on the portion of the mesh 16 that is exposed from the printing pattern openings 18.

Further, when the primer layer of the present disclosure is coated with a fluorine-containing silane coupling agent, the fluorine-containing silane coupling agent may enter the defects such as pinholes in the primer layer by capillarity, and the wall surface of the pinholes may be coated with the fluorine-containing silane coupling agent. Thus, the weather resistance of the substrate may be improved. For example, a solvent that attacks a substrate and is used as a binder or a solvent of a printing paste may be prevented from entering the pinholes by reverse capillarity, thereby to protect the substrate such as an emulsion for a stencil printing plate that is sensitive to solvents and tends to swell to be deformed.

When a coating layer having water repellence and/or water and oil repellence is formed on a stencil printing plate or a mesh with a primer layer of the present disclosure therebetween, the paste can be readily removed from the printing pattern openings and the mesh openings after printing. This may prevent damage to the stencil caused by solidification of the paste left unremoved.

In the use situation, the screen printing plate 10 having such a configuration is disposed such that the lower surface 26 of the emulsion 14 faces a recording medium. After the screen printing plate 10 is disposed at a predetermined position, printing paste, such as solder paste or metallic paste for forming an inner electrode of an electronic component, may be applied onto an upper surface 24, and then a squeegee (not illustrated) may be slid along the upper surface 24 while the upper surface 24 is pressed by the squeegee at a certain level of pressure, so that the applied printing paste passes through the printing pattern opening 18 and is then transferred to the printing medium. In addition to these printing pastes, the screen printing plate 10 may be used to transfer printing ink, dye, paint, antirust, adhesive, reactive material, slurry for green sheets, resist for lithography, pressure-sensitive material, temperature-sensitive material, and adsorbent.

The mesh 16 may also be applied to a stencil printing plate that can be used in printing other than screen printing (transcription). The mesh 16 may be applied to, for example, a stencil printing plate for pressure printing, in which an ink forced by a pressure mechanism such as an ink jet mechanism is transferred to a printing medium, and vacuum printing, in which an ink is transferred to a printing medium provided with a lower pressure. The printing methods that can use the stencil printing plate including the mesh 16 having formed thereon an amorphous carbon film of the present disclosure are not limited to those stated herein.

An example of a method for manufacturing the screen printing plate 10 will now be described. The first step may be to prepare a frame 12 comprising an iron casting, a stainless steel, and an aluminum alloy and a mesh 16 having formed thereon by sputtering, etc. a thin primer film containing at least one of silicon, titanium, aluminum, aluminum oxide, and zirconium. The mesh 16 may be affixed on the frame 12. The mesh 16 may be either directly attached to the frame 12 or indirectly attached via a support screen. Then, the sensitive emulsion 14 may be applied to the mesh 16, and the printing pattern opening 18 corresponding to a print pattern may be formed in the emulsion 14 by a photolithographic method. Then, the thin coating film 20 of a fluorine-containing silane coupling agent may be formed on the surface of the mesh 16 exposed in the printing pattern opening 18 and facing toward the lower surface 26, to complete the screen printing plate 10.

Figure 3:
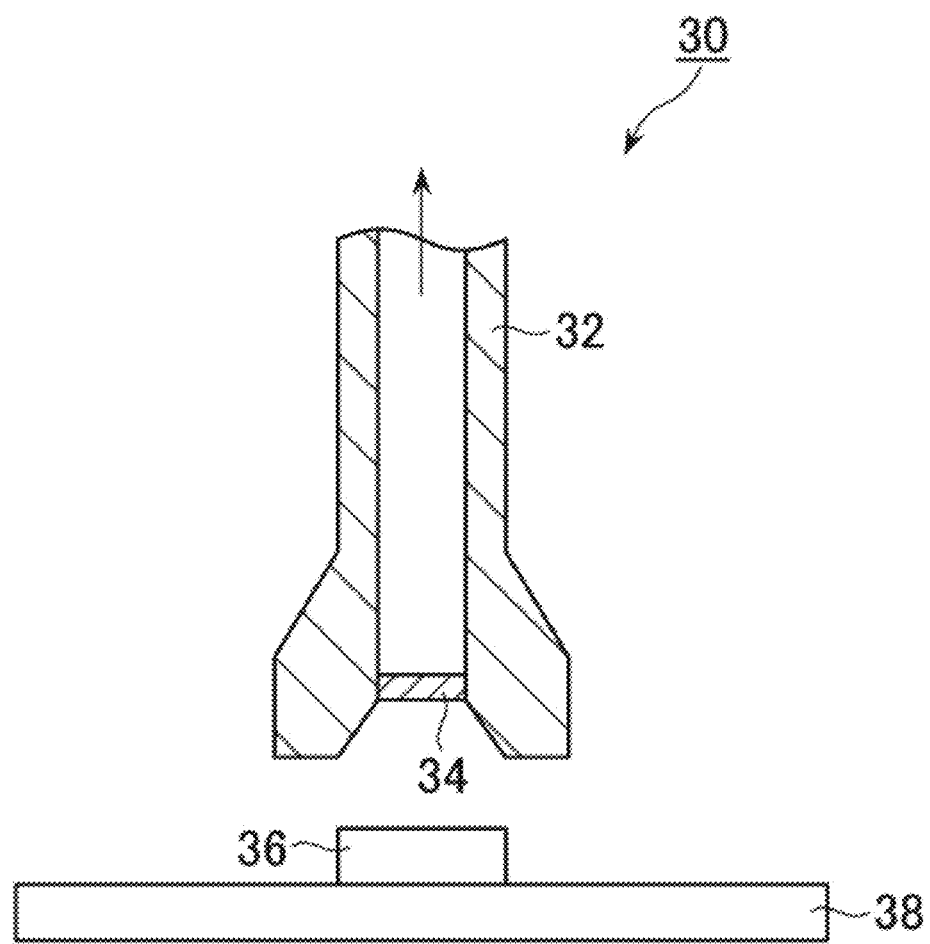
FIG. 3 is a schematic view illustrating a part of an electronic component conveyor having a porous sheet according to an embodiment of the present disclosure.

FIG. 3 is a schematic view illustrating a part of an adsorbing collet installed on an electronic component conveyor 30 having a porous sheet according to an embodiment of the present disclosure. The adsorbing collect 32 may be installed on a desired electronic component conveyor so as to be movable vertically and horizontally. As shown, the adsorbing collet 32 may be tubularly shaped with one end thereof being connected to a negative-pressure source not shown. Near an adsorbing port of the adsorbing collet 32 may be provided a porous sheet 34 according to an embodiment of the present disclosure. An electronic component 36 may rest on a wafer sheet 38. When this electronic component 36 is conveyed from the wafer sheet to another working space, the adsorbing collet 32 may be positioned on the electronic component 36 and a negative pressure may be supplied from the negative-pressure source; thus, the electronic component 36 may be adsorbed near the adsorbing port of the adsorbing collet 32. Next, the adsorbing collet 32 having adsorbed thereon the electronic component 36 may be moved to a working space, where the supply of the negative pressure may be stopped; thus, the electronic component 36 may be conveyed to the working space. Such an adsorbing collet 32 is disclosed in, for example, Japanese Patent Application Publication No. 2011-014582 and is obvious to those skilled in the art as to detailed configuration and operations thereof. The detailed description of the above collet 32 will be omitted herein. Additionally, the adsorbing collet 32 may be used for conveying various components other than electronic components, such as a green sheet.

The porous sheet 34 may be composed of, for example, a synthetic resin such as polypropylene, a metal such as stainless steel, a ceramic such as zirconia, a breathable fabric such as bandage, an unwoven fabric, or a combination thereof; and the porous sheet 34 may include openings as does the above screen printing mesh 16. On the surface of the porous sheet 34 may be formed a thin primer layer according to an embodiment of the present disclosure containing at least one of silicon, titanium, aluminum, aluminum oxide, and zirconium by a dry process such as sputtering; and on this thin primer film may be formed a fluorine-containing silane coupling agent layer. This thin primer layer may be formed in the same method as the above thin primer film formed on the mesh 16. Accordingly, the thin primer film according to an embodiment of the present disclosure can be formed so as not to clog the openings of the porous sheet 34. The thin primer film according to an embodiment of the present disclosure may be formed selectively on the portion of the porous sheet 34 where the electronic component 36 is adsorbed. Thus, no thin primer film (or fluorine-containing silane coupling agent) may be formed on the contact portion between the porous sheet 34 and the adsorbing collet 32; and thus the adhesion between the porous sheet 34 and the adsorbing collet 32 may be ensured.

The porous sheet 34 can securely retain the fluorine-containing silane coupling agent as a thin primer film comprising the primer composition according to an embodiment of the present disclosure; therefore, the porous sheet 34 may have a smooth surface and resist wear. Thus, when the electronic component 36 is being conveyed, the electronic component 36 may be inhibited from being adhered to the porous sheet 34, and the pores in the porous sheet may be inhibited from being clogged with absorbed dust and foreign bodies; thus, the electronic component 36 can be efficiently conveyed. The porous sheet 34 may have unevenness in the surface thereof. The fluorine-containing silane coupling agent applied into cavities may be protected from externally exerted stresses by convexities having a hard silicon film, titanium film, aluminum oxide film, or zirconia film; and thus the fixity on the porous sheet 34 is very high.

The above screen printing mesh and the porous sheet for electronic component conveyor are mere examples to which the thin primer film of the present disclosure is applied. The thin primer film of the present disclosure may be used for any type of works that may suffer clogging by a liquid primer. For example, the thin primer film of the present disclosure may be applied to a sieving mesh, a liquid cleaning mesh (cleaning sieve, cleaning net, etc.), a mesh for barrel plating apparatuses, filters such as strainer, and/or any other members in which a liquid primer may clog the openings.

EXAMPLES

It was confirmed by the following method that a fluorine-containing silane coupling agent can be applied with excellent fixity on a thin primer layer according to an embodiment of the present disclosure containing at least one of silicon, titanium, aluminum, aluminum oxide, and zirconium. First, samples (Examples 1 to 9) were prepared, each comprising a thin primer film containing at least one of Si, Ti, Al, $Al_2O_3$, and Zr and formed on the surface of a stainless steel piece (SUS304), the thin primer film being provided with a fluorine coating (fluorine-containing silane coupling agent). Each of the samples was subjected to measurement of contact angles with water (pure water) to investigate the fixity of the fluorine coating layer. If the fluorine-containing silane coupling agent is retained on the thin primer film, the contact angle with water may be high because of the water repellency; therefore, it can be confirmed by measuring the contact angle whether the fluorine-containing silane coupling agent is retained on the thin primer film.

1. Preparation of Samples

First, substrates composed of stainless steel (SUS304) were prepared for each sample. These stainless steel (SUS304) substrates had a rectangular shape with a side length of 30 mm, a thickness of 1 mm, and a surface roughness Ra of about 0.05 μm and were subjected to 15 minutes of cleaning using isopropyl alcohol (IPA) in an ultrasonic cleaning apparatus.

(1) Preparation of Sample for Example 1

The first step was to place the above stainless steel (SUS304) substrate and an Si target having a purity of 99.999% and a size of 101.6φ×5 t (mm) (from Kojundo Chemical Laboratory Co., Ltd) mutually opposed and separated at a distance of about 12 cm in a high-pressure DC pulsed plasma CVD apparatus, and evacuate the CVD apparatus to $3\times10^{-3}$ Pa. Next, Ar gas was introduced into the CVD apparatus at a flow rate of 40 SCCM and an internal gas pressure of 1.5 Pa; and the sample was sputtered at an applied voltage of −4.5 kVp, a pulse frequency of 10 kHz, and a pulse width of 10 is for a total of 30 minutes thereby to deposit an Si thin film layer on the sample-bearing surface of the substrate. A solution of a fluorine-containing silane coupling agent FG-5010Z130-0.2 (from Fluoro Technology Corporation) (containing 0.02 to 0.2% fluorine resin and 99.8 to 99.98% fluorine-based solvent) was applied through a dip coating process onto the substrate having formed thereon the Si thin film layer. The product was dried at room temperature for two days to yield a sample for Example 1.

(2) Preparation of Sample for Example 2

As with Example 1, the stainless steel (SUS304) substrate and an Si target were placed in the high-pressure DC pulsed plasma CVD apparatus; and the CVD apparatus was evacuated to $3\times10^{-3}$ Pa. Next, a mixture of Ar gas and oxygen was introduced into the CVD apparatus at respective flow rates of 20 SCCM and 20 SCCM and an internal gas pressure of 1.5 Pa; and the sample was sputtered at an applied voltage of −4.5 kVp, a pulse frequency of 10 kHz, and a pulse width of 10 μs for 30 minutes using the mixture gas as a sputter gas, thereby to deposit an Si thin film layer on the sample-bearing surface of the substrate in an oxygen atmosphere. As with Example 1, a solution of FG-5010Z130-0.2 was applied through a dip coating process onto the substrate having formed thereon the Si thin film layer. The product was dried at room temperature for two days to yield a sample for Example 2.

(3) Preparation of Sample for Example 3

The above stainless steel (SUS304) substrate was placed on a turntable in a reaction container of the SRDS-7000T general-purpose compact deposition apparatus (from Sanyu Electron Co., Ltd); the reaction container was evacuated to $1\times10^{-4}$ Pa; and then the substrate was reverse-sputtered for one minute at an RF output of 100 W, clockwise sample table rotations of 10 rpm, and a sample table temperature equal to a room temperature (without heating or water cooling) by using Ar gas at flow rate of 100 SCCM and a gas pressure of 10 Pa. Subsequently, the substrate was sputtered for three minutes at an output DC of 400 W, a T-S distance of 100 mm, an offset of 40 mm, clockwise sample table rotations of 10 rpm, counterclockwise magnetic fluctuation of 5 rpm, a sample table temperature equal to a room temperature (without heating or water cooling) by using Ar gas at a flow rate of 100 SCCM and a gas pressure of 2 Pa. When the substrate was exposed to the atmosphere, a Ti thin film layer was deposited on the sample-bearing surface of the substrate under the condition of three minutes of N2 gas leak. The Ti target used was that of 2N8 101.6φ×5 t DB (from Sony Chemical Information Device Corporation). As with Example 1, a solution of FG-5010Z130-0.2 was applied through a dip coating process onto the substrate having formed thereon the Ti thin film layer. The product was dried at room temperature for two days to yield a sample for Example 3.

(4) Preparation of Sample for Example 4

A sample comprising an Si thin film layer formed on the stainless steel (SUS304) substrate was prepared by the same method as for Example 1. Next, this sample was placed into the high-pressure DC pulsed plasma CVD apparatus, which was then evacuated to $1\times10^{-3}$ Pa; and oxygen gas was introduced into the CVD apparatus at a flow rate of 30 SCCM and a gas pressure of 2 Pa; and the sample surface was exposed to oxygen plasma at an applied voltage of $-2.5$ kV, a pulse frequency of 10 kHz, and a pulse width of 10 μs for 2 minutes, such that the Si thin film layer contained oxygen. As with Example 1, a solution of FG-50102130-0.2 was applied through a dip coating process onto the substrate having formed thereon the oxygen-containing Si thin film layer. The product was dried at room temperature for two days to yield a sample for Example 4.

(5) Preparation of Sample for Example 5

A sample comprising an Ti thin film layer formed on the stainless steel (SUS304) substrate was prepared by the same method as for Example 3. Next, this sample was placed into the high-pressure DC pulsed plasma CVD apparatus, which was then evacuated to $1\times10^{-3}$ Pa; and oxygen gas was introduced into the CVD apparatus at a flow rate of 30 SCCM and a gas pressure of 2 Pa; and the sample surface was exposed to oxygen plasma at an applied voltage of $-2.5$ kV, a pulse frequency of 10 kHz, and a pulse width of 10 μs for 2 minutes, such that the Ti thin film layer contained oxygen. As with Example 1, a solution of FG-50102130-0.2 was applied through a dip coating process onto the substrate having formed thereon the oxygen-containing Ti thin film layer. The product was dried at room temperature for two days to yield a sample for Example 5.

(6) Preparation of Sample for Example 6

A sample comprising an Si oxide thin film layer formed on the stainless steel (SUS304) substrate was prepared by the same method as for Example 2. Next, this sample was placed into the high-pressure DC pulsed plasma CVD apparatus, which was then evacuated to $1\times10^{-3}$ Pa; and nitrogen gas was introduced into the CVD apparatus at a flow rate of 30 SCCM and a gas pressure of 2 Pa; and the sample surface was exposed to nitrogen plasma at an applied voltage of $-2.5$ kV, a pulse frequency of 10 kHz, and a pulse width of 10 μs for 2 minutes, such that the Si oxide layer contained nitrogen. As with Example 1, a solution of FG-5010Z130-0.2 was applied through a dip coating process onto the substrate having formed thereon the nitrogen-containing Si oxide thin film layer. The product was dried at room temperature for two days to yield a sample for Example 6.

(7) Preparation of Sample for Example 7

A sample comprising an Ti thin film layer formed on the stainless steel (SUS304) substrate was prepared by the same method as for Example 3. Next, this sample was placed into the high-pressure DC pulsed plasma CVD apparatus, which was then evacuated to $1\times10^{-3}$ Pa; and nitrogen gas was introduced into the CVD apparatus at a flow rate of 30 SCCM and a gas pressure of 2 Pa; and the sample surface was exposed to nitrogen plasma at an applied voltage of $-2.5$ kV, a pulse frequency of 10 kHz, and a pulse width of 10 μs for 2 minutes, such that the Ti thin film layer contained nitrogen. As with Example 1, a solution of FG-5010Z130-0.2 was applied through a dip coating process onto the substrate having formed thereon the nitrogen-containing Ti thin film layer. The product was dried at room temperature for two days to yield a sample for Example 7.

(8) Preparation of Sample for Example 8

The stainless steel (SUS304) substrate and an Al target were placed on the turntable in the reaction container of the SRDS-7000 general-purpose compact deposition apparatus (from Sanyu Electron Co., Ltd.) so as to be mutually opposed, and the reaction container was evacuated to $1\times10^{-4}$ Pa. Subsequently, the substrate was reverse-sputtered under the same condition as Example 3, and then was sputtered for five minutes at an output DC of 400 W, a T-S distance of 100 mm, OFS of 55 mm, and sample table rotations of 10 rpm by using Ar gas as a sputtering gas at a flow rate of 100 SCCM and a gas pressure of 3 Pa. Thus, an Al thin film layer was formed on the substrate. As with Example 1, a solution of FG-5010Z130-0.2 was applied through a dip coating process onto the substrate having formed thereon the Al thin film layer. The product was dried at room temperature for two days to yield a sample for Example 8. The Al target used was Al 4N 4"φ×5 t having a purity of 99.99% from Kojundo Chemical Laboratory Co., Ltd.

(9) Preparation of Sample for Example 9

The stainless steel (SUS304) substrate and an $Al_2O_3$ target were placed on the turntable in the reaction container of the SRDS-7000 general-purpose compact deposition apparatus (from Sanyu Electron Co., Ltd.) so as to be mutually opposed, and the reaction container was evacuated to $1\times10^{-4}$ Pa. Subsequently, the substrate was reverse-sputtered under the same condition as Example 3, and then was sputtered for 70 minutes at an output RF of 400 W, a T-S distance of 100 mm, OFS of 55 mm, and sample table rotations of 10 rpm by using a mixture sputtering gas of Ar gas and $O_2$ gas both at a flow rate of 100 SCCM, the mixture sputtering gas having a gas pressure of 10 Pa. Thus, an $Al_2O_3$ thin film layer was formed on the substrate. As with Example 1, a solution of FG-5010Z130-0.2 was applied through a dip coating process onto the substrate having formed thereon the $Al_2O_3$ thin film layer. The product was dried at room temperature for two days to yield a sample for Example 9. The $Al_2O_3$ target used was $Al_2O_3$ 4N 4"φ×5 t having a purity of 99.99% from Kojundo Chemical Laboratory Co., Ltd.

(8) Preparation of Sample for Comparative Example 1

As with Example 1, a solution of FG-5010Z130-0.2 was applied through a dip coating process onto a stainless steel (SUS304) substrate having no film formed thereon. The product was dried at room temperature for two days to yield a sample for Comparative Example 1.

Measurement of the Contact Angle with Water by an Ultrasonic Fatigue Acceleration Test Next, each of the samples was placed into isopropyl alcohol (IPA) and time-course degradation of contact angles of the samples with water through the fatigue acceleration test by ultrasonic cleaning, thereby to investigate the fixity of the fluorine-containing silane coupling agent on the thin primer film. The test was carried out by using US-20KS from SND Co., Ltd. at oscillation of 38 kHz (BLT self-excitation oscillation) and a high-frequency output of 480 W. In ultrasonic cleaning, strong vibrations were locally generated by a piezoelectric vibrator to generate cavities in IPA. When the cavities crush on the surface of the substrate, the crushed cavities generate a great physical impact force on the surface of the substrate; therefore, it is suitable to determine the adhesion power between the substrate and a thin film formed thereon. A fluorine-containing silane coupling agent loosely bound to the thin primer film may be removed from the surface of the substrate by an impact from the cavities; the adhesion between the fluorine-containing silane coupling agent and the thin primer film thereunder can be determined by investigating the contact angle at the surface of the substrate.

Figure 4:
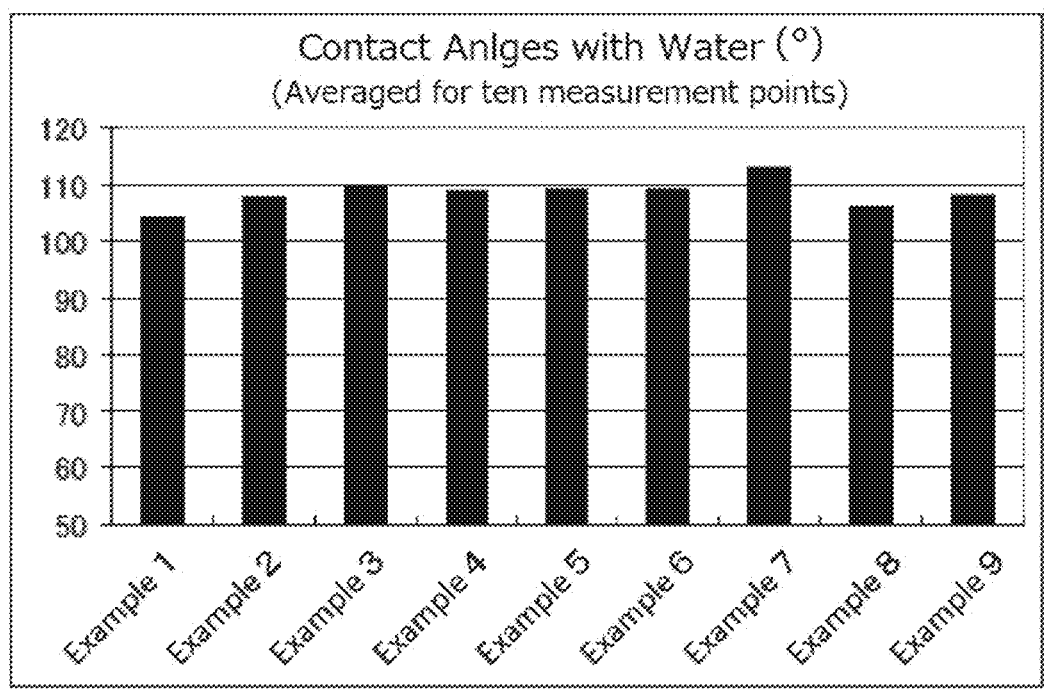
FIG. 4 is a graph showing a measurement result of contact angles with water in Examples 1 to 9 subjected to five minutes of ultrasonic cleaning.

FIG. 4 is a graph showing a measurement result of contact angles with water in Examples 1 to 9 subjected to five minutes of ultrasonic cleaning. The ordinate of FIG. 4 indicates the average value of the contact angles measured at ten measuring points on the sample. The measurement of the contact angles was carried out with a portable contact angle analyzer "PG-X" (mobile contact angle tester) from FIBRO System AB, at a room temperature of 25° C. and a humidity of 30%. As shown, each of the samples for Examples 1 to 9 retained a contact angle of not less than 100°. Each result of the measurement demonstrates that a sufficient amount of fluorine-containing silane coupling agent was remaining on a surface of the sample to exhibit a water repellence.

In contrast, for Comparative Example 1 subjected to five minutes of ultrasonic cleaning, the contact angle between the sample and water was about 95°. The test for Comparative Example was terminated when it was confirmed that the average contact angle with water was reduced to about 91° after further 30 minutes of ultrasonic cleaning. The contact angle of 91° is near the border of "water repellence" and is near the contact angle of a stainless steel substrate itself with water before application of the fluorine-containing silane coupling agent (about 80°). Thus, it was confirmed for Comparative Example 1 that the fluorine-containing silane coupling agent was removed by as short as about 30 minutes of ultrasonic cleaning.

Figure 5:
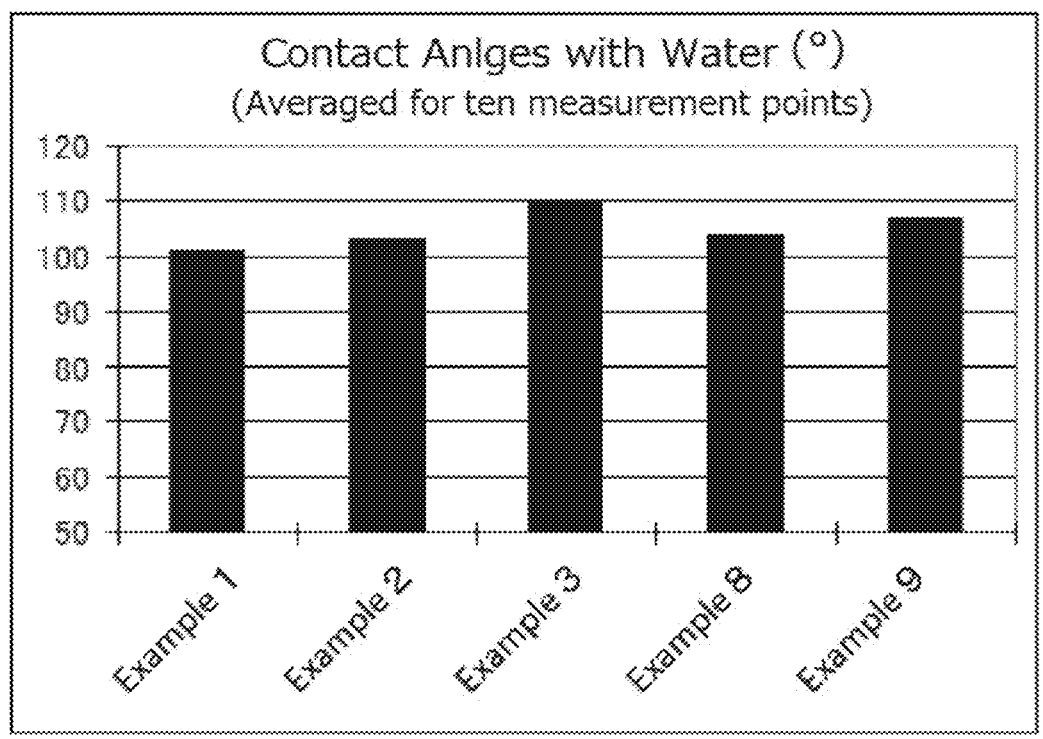
FIG. 5 is a graph showing a measurement result of contact angles with water in Examples 1 to 3 and 8 to 9 subjected to 120 minutes of ultrasonic cleaning.

FIG. 5 is a graph showing a measurement result of contact angles with water in Examples 1 to 3 and 8 to 9 subjected to 120 minutes of ultrasonic cleaning. The ordinate of FIG. 4 indicates the average value of the contact angles measured at ten measuring points on the sample. As shown, each of the samples for Examples 1 to 3 and 8 to 9 retained a contact angle of not less than 100°. Thus, it was confirmed for Examples 1 to 3 that the layer comprising a sufficient amount of fluorine-containing silane coupling agent remained on the surface of the samples to exhibit water repellence even after 120 minutes of ultrasonic cleaning. For Examples 4 to 7, the thin primer layers contain oxygen or nitrogen due to application of oxygen plasma or nitrogen plasma, and thus were presumably more tightly bound to the fluorine-containing silane coupling agent therefore, the contact angles were not measured after 120 minutes of ultrasonic cleaning. As will be described later, the samples 4 to 7 retained high contact angles even after 240 minutes of ultrasonic cleaning; therefore, these samples should also have retained high contact angles after 120 minutes of ultrasonic cleaning.

Figure 6:
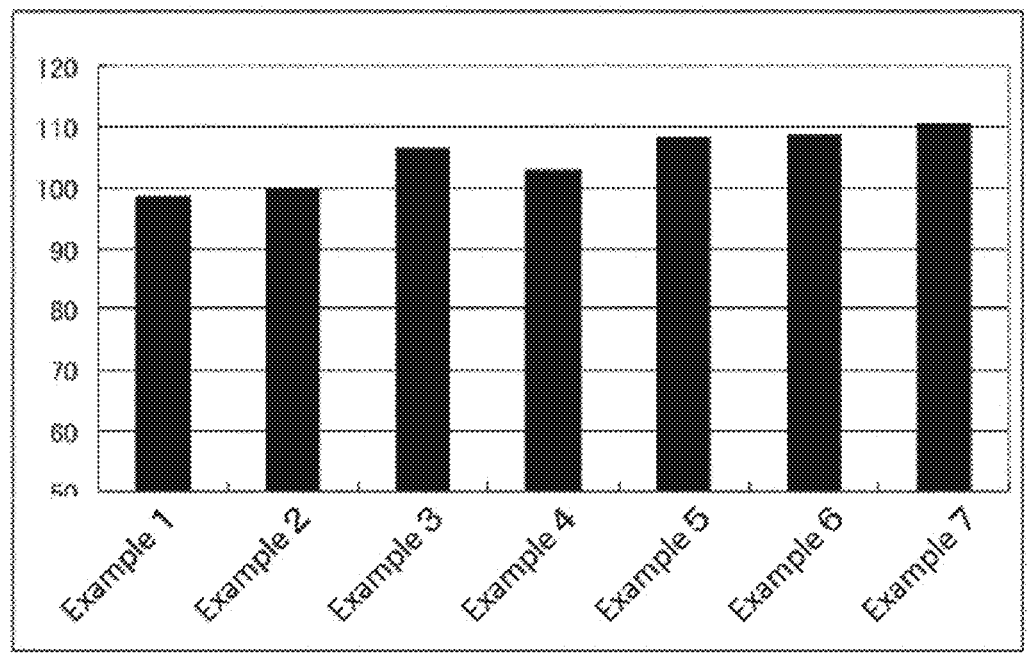
FIG. 6 is a graph showing a measurement result of contact angles with water in Examples 1 to 7 subjected to 240 minutes of ultrasonic cleaning.

FIG. 6 is a graph showing a measurement result of contact angles with water in Examples 1 to 7 subjected to 240 minutes of ultrasonic cleaning. The ordinate of FIG. 4 indicates the average value of the contact angles measured at ten measuring points on the sample. As shown, each of the samples for Examples 1 to 7 retained a contact angle of not less than 95°. Particularly, Examples 3 to 7 exhibited high contact angles of not less than 100°. Each result of the measurements for Examples 1 to 7 demonstrates that the layer comprising a sufficient amount of fluorine-containing silane coupling agent remained on a surface of the sample to exhibit water repellence. It was confirmed from the above experimental results that the fluorine-containing silane coupling agent was tightly fixed on the substrate in Examples 1 to 9.

Analysis of Functional Groups in Si, Ti, and $Al_2O_3$ Thin Films

Next, the functional groups in the thin primer layer containing Si, Ti, or $Al_2O_3$ were analyzed in the following method. First, a stainless steel (SUS304) substrate having a rectangular shape with a side length of 30 mm, a thickness of 1 mm, and a surface roughness Ra of 0.034 μm was prepared and subjected to 15 minutes of ultrasonic cleaning using isopropyl alcohol (IPA) in an ultrasonic cleaning apparatus.

A Thin Film Comprising Si

A sample comprising an Si thin film layer formed on the stainless steel (SUS304) substrate was prepared by the same method as for Example 1. Next, PHI TRIFT 2 TOF-SIMS (Ga ion, 25 kV) from ULVAC-PHI, Inc. was used to carry out qualitative analysis of hydroxyl groups present in the surface of the sample. As a result of measurement in the negative ion mode, a sharp peak was detected in the range of m/z 17.003±0.010, confirming the presence of OH (hydroxyl groups).

A Thin Film Comprising Ti

A sample comprising an Ti thin film layer formed on the stainless steel (SUS304) substrate was prepared by the same method as for Example 3. Next, PHI TRIFT 2 TOF-SIMS (Ga ion, 25 kV) from ULVAC-PHI, Inc. was used to carry out qualitative analysis of hydroxyl groups present in the surface. As a result of measurement in the negative ion mode, a sharp peak was detected in the range of m/z 17.003±0.010, confirming the presence of OH (hydroxyl groups).

A Thin Film Comprising $al_2O_3$

A sample comprising an $Al_2O_3$ thin film layer formed on the stainless steel (SUS304) substrate was prepared by the same method as for Example 9. Then, the functional groups were estimated from the absorption spectrum obtained by Fourier-transform infrared spectroscopy (FT-IR analysis). The measurement used HYPERION 3000 from Bruker Corporation. As a result of 32 time measurements by the micro-ATR method with eight waves in reflection absorption spectroscopy, it was confirmed that OH (hydroxyl group) was formed near 3,600 to 3,300 ($cm^{-1}$). For Al thin film (Al thin film layer formed by the same method as Example 8) which is an embodiment of the present disclosure, a passive layer of aluminum oxide is naturally formed on the surface layer of aluminum contacting the atmosphere; therefore, it is presumed that hydroxyl groups were formed as for $Al_2O_3$ described above.

Thus, it was confirmed that the thin primer film layer according to an embodiment of the present disclosure has hydroxyl groups formed therein. Further, the hydroxyl groups in the thin primer film layer form —O-M bonds (M is any one element selected from the group consisting of Si, Ti, Al, and Zr) by condensation reaction with the fluorine-containing silane coupling agent; therefore, it was confirmed that the thin primer film layer in the present disclosure tightly binds to the fluorine-containing silane coupling agent.

A Printing Experiment Using a Screen Mask

Next, it was confirmed by the following process that the openings in the mesh for screen printing plate according to an embodiment of the present disclosure were substantially not clogged with the printing paste. First, stainless steel pieces were cut to prepare three meshes (SS325-16) with a size of 300 mm by 300 mm. The meshes include 325 stainless steel wire rods per one inch width, and the stainless steel wire rods have a diameter of 16 μm. Next, three stencil printing plate frames having a Tetoron mesh previously affixed thereon were prepared; and on these Tetoron meshes, the above meshes (SS325-16) previously prepared were affixed one on one. Next, each of the meshes (SS325-16) was coated with an emulsion film composed mainly of 13% vinyl acetate-based emulsion, 8% polyvinyl alcohol, 14% photopolymerization resin, and 65% water. The emulsion films were formed such that the film thickness is about 20 μm, the total thickness of the emulsion screen including the stainless steel mesh is about 48 μm, and the bias angle of the stainless steel mesh is 30°.

Next, a printing pattern was formed on the emulsion film by photolithography. More specifically, the printing pattern has a comb-like shape comprising a straight bus electrode formed in the middle of the mesh and having a line width of 1,500 μm and a length of about 10 cm and a plurality of thin lines (finger electrode wires) extending orthogonally to the bus electrode and having a length of about 5 cm and a line width of about 70 μm.

Next, one of the meshes having the printing pattern formed thereon is placed in a high-pressure DC pulsed plasma CVD apparatus; then, an Si thin film layer was formed on the mesh (more specifically, the entirety of areas encompassing the printing pattern openings in the emulsion screen printing plate, including the portions of the mesh exposed in the printing pattern openings) by using an Si target having a purity of 99.999% and a size of 101.6φ×5 t (mm) (from Kojundo Chemical Laboratory Co., Ltd), as for Example 1. More specifically, the CVD apparatus was evacuated to 3×10$^{-3}$ Pa; and then the mesh was sputtered by argon gas plasma for 90 seconds at an applied voltage of −4 kVp, a pulse frequency of 10 kHz, and a pulse width of 10 μs by using Ar gas at a flow rate of 30 SCCM and a gas pressure of 1.5 Pa. Next, the plasma process was stopped to cool the emulsion film and the mesh, and 15 minutes later the sputtering by argon gas plasma was resumed and kept for 90 seconds under the same condition such that an Si thin film layer was deposited on the entirety of effective printing pattern area on the printing surface of the screen printing plate including the mesh surface. A solution of a fluorine-containing silane coupling agent FG-5010Z130-0.2 (from Fluoro Technology Corporation) (containing 0.02 to 0.2% fluorine resin and 99.8 to 99.98% fluorine-based solvent) was applied with an unwoven fabric onto the mesh and the emulsion film having formed thereon the Si thin film layer. The product was dried at room temperature for two days to yield a sample for Example 10.

Next, another of the meshes having the printing pattern formed thereon was placed in a high-pressure DC pulsed plasma CVD apparatus; then, an Si thin film layer was formed on the mesh (the entirety of the effective printing pattern area on the emulsion screen printing plate, including the portions of the mesh exposed in the printing pattern openings) by using an Si target having a purity of 99.999% and a size of 101.6φ×5 t (mm) (from Kojundo Chemical Laboratory Co., Ltd), as for Example 10. More specifically, the CVD apparatus was evacuated to 3×10$^{-3}$ Pa; and then the mesh was sputtered by argon gas plasma for 90 seconds at an applied voltage of −4 kVp, a pulse frequency of 10 kHz, and a pulse width of 10 μs by using a mixture of Ar gas at a flow rate of 30 SCCM and oxygen gas at a flow rate of 10 SCCM, the mixture gas having a gas pressure of 1.5 Pa. Next, the plasma process was stopped to cool the emulsion film and the mesh, and 15 minutes later the sputtering by argon gas plasma was resumed and kept for 90 seconds under the same condition such that an Si thin film layer was deposited on the mesh surface in an oxygen atmosphere. A solution of a fluorine-containing silane coupling agent FG-5010Z130-0.2 (from Fluoro Technology Corporation) (containing 0.02 to 0.2% fluorine resin and 99.8 to 99.98% fluorine-based solvent) was applied with an unwoven fabric onto the mesh having formed thereon the Si oxide thin film layer. The product was dried at room temperature for two days to yield a sample for Example 11.

The remaining mesh having the printing pattern formed thereon (an emulsion screen printing plate not subjected to surface treatment) was treated as Comparative Example 2.

Next, the emulsion screen printing plates of Examples 10 and 11 and Comparative Example 2 were set on a printing machine to perform printing under the following condition. High-viscosity printing paste: (an equivalent to) X7348S-17 from NAMICS CORPORATION, Ag paste particle size φ: 1 μm, squeegee: urethane squeegee, squeegee attack angle: 70°, squeegee speed: 110 mm/s, offset 1 mm, squeegee depression: 2 mm, and printing medium: Pet film "Lumirror" from Toray Industries, Inc.

Figure 7:
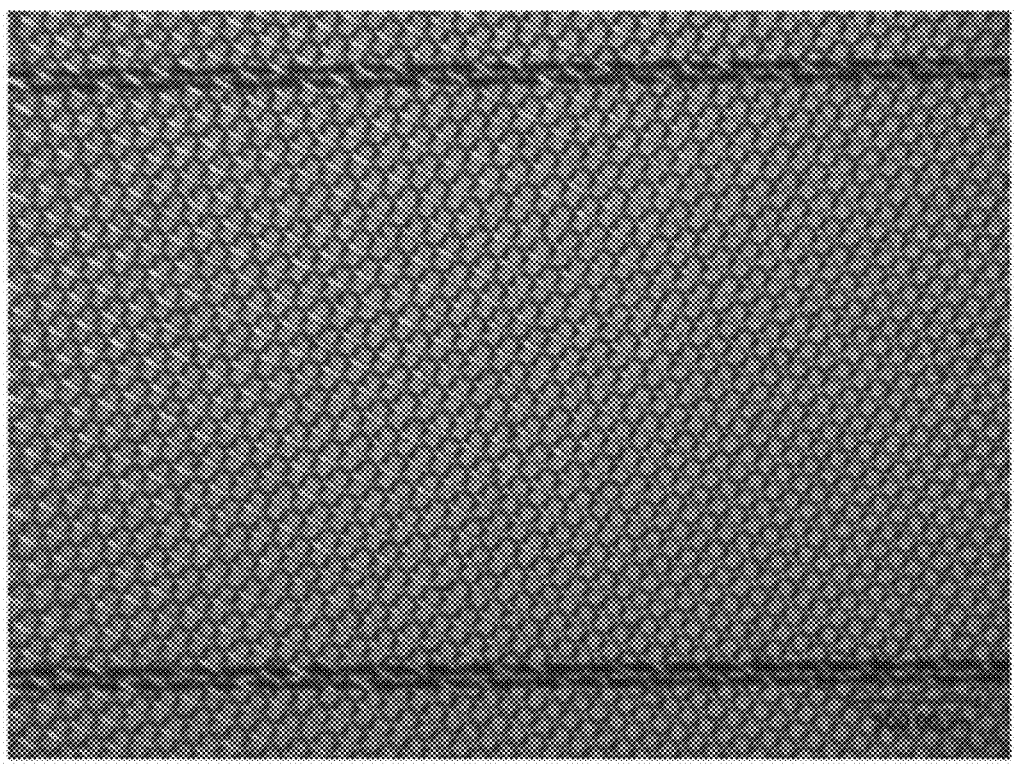
FIG. 7 is a photograph of a printing pattern opening in the sample surface of Example 10.
Figure 8:
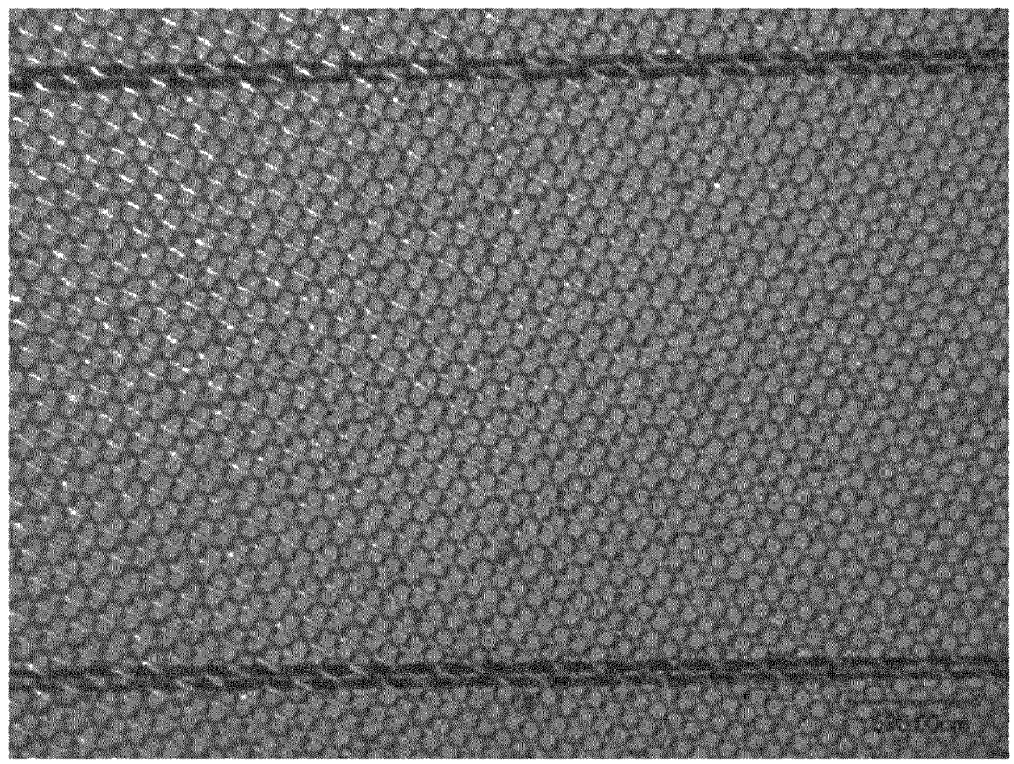
FIG. 8 is a photograph of a printing pattern opening in the sample surface of Example 11.
Figure 9:
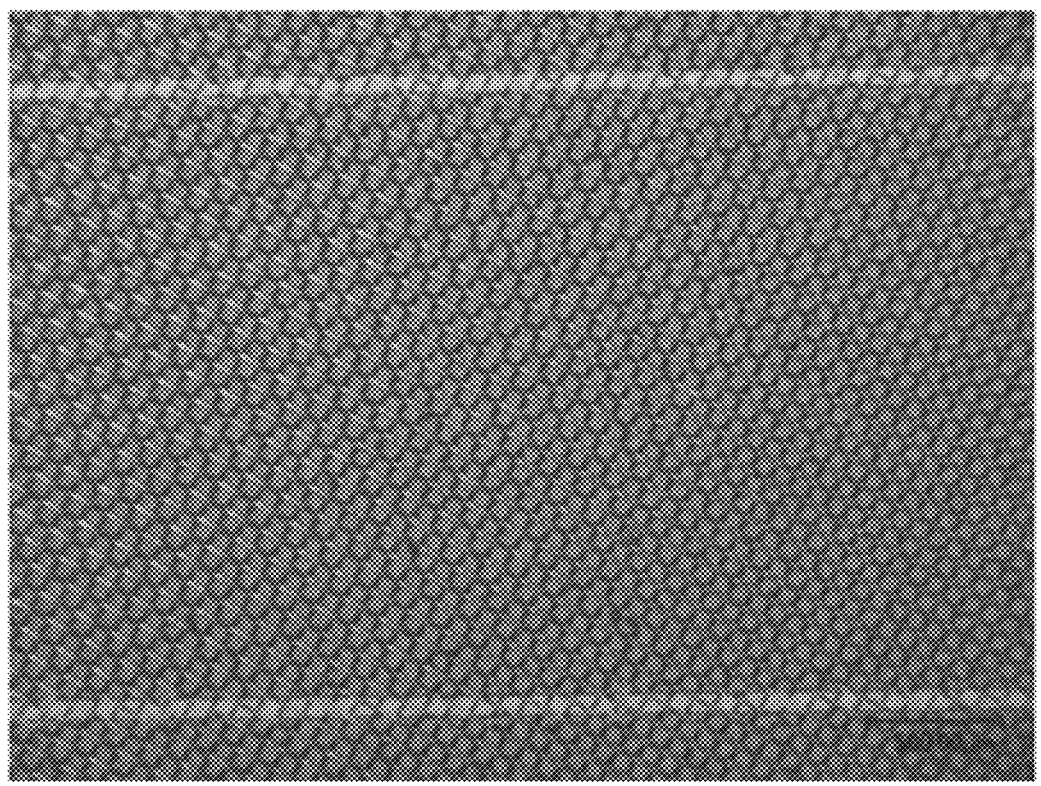
FIG. 9 is a photograph of a printing pattern opening in the sample surface of Comparative Example 2.

After printing, the printing pattern openings in the emulsion screen printing plate were observed for each of Examples 10 and 11 and Comparative Example 2 without surface cleaning of the emulsion pattern openings using a cleaning liquid such as a thinner. The observation results are shown in FIGS. 7 to 9. FIG. 7 is a photograph of the sample surface of Example 10; FIG. 8 is a photograph of the sample surface of Example 11; and FIG. 9 is a photograph of the sample surface of Comparative Example 2. FIGS. 7 and 8 clearly shows the printing pattern openings as black horizontal lines in the upper and lower portions of the photographs, indicating that there is no clogging by the printing paste; and no clogging was observed in the mesh openings. Further, it was confirmed that the printing paste was transferred to the printing medium (PET film) in accordance with the printing pattern. In contrast, FIG. 9 shows the printing pattern openings as gray horizontal lines in the upper and lower portions of the photographs, indicating that the printing pattern openings are clogged with the printing paste. Thus, in Examples 10 and 11, the fluorine resin layers formed of the fluorine-containing silane coupling agent were tightly fixed on the mesh surface via a thin primer layer according to an embodiment of the present disclosure; and the fluorine resin layers formed of the fluorine-containing silane coupling agent improved the demoldability of the printing paste. In contrast, in Comparative Example 2, it is presumed that the printing paste was adhered to the portion of the mesh where the base material was exposed and the fluorine resin thin film of the fluorine-containing silane coupling agent was not formed. Thus, no mesh opening was clogged with the thin primer film in the screen printing meshes (Examples 10 and 11) according to an embodiment of the present disclosure.

Figure 10:
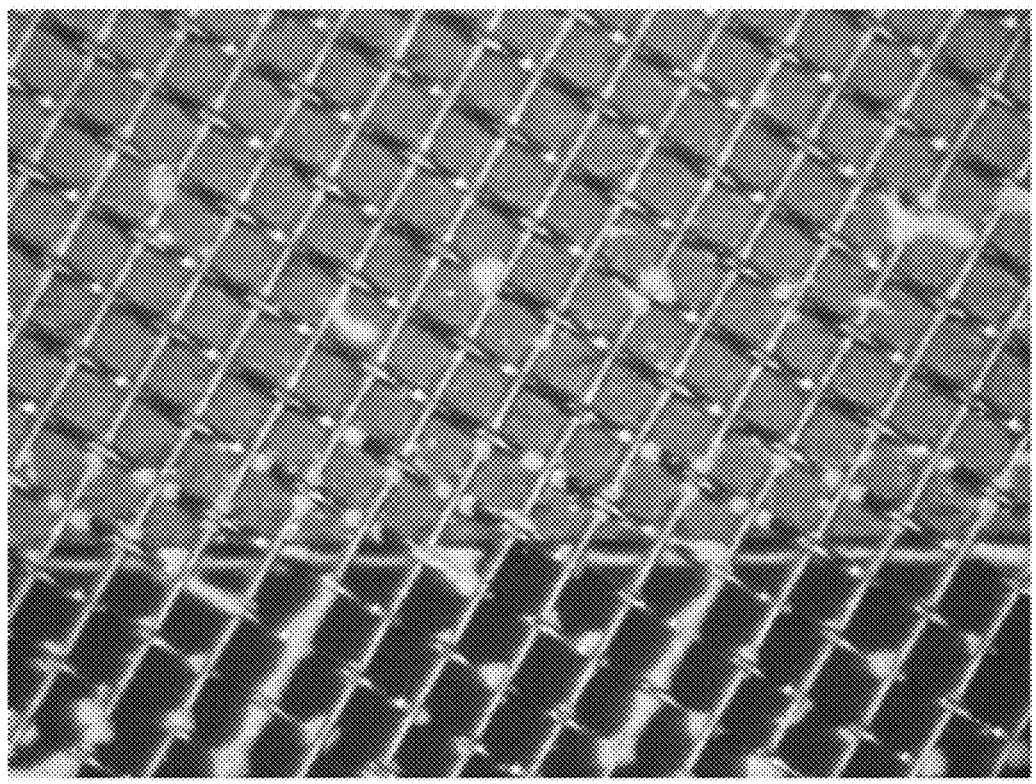
FIG. 10 is a photograph of an emulsion part on the sample surface of Example 10.
Figure 11:
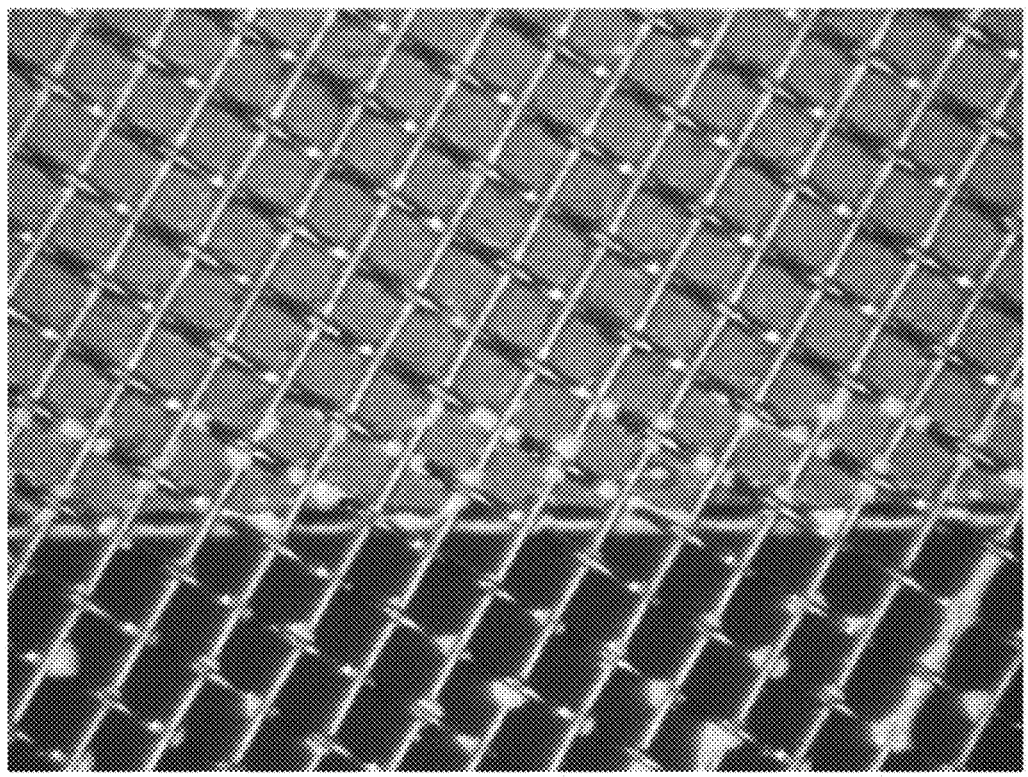
FIG. 11 is a photograph of an emulsion part on the sample surface of Example 11.
Figure 12:
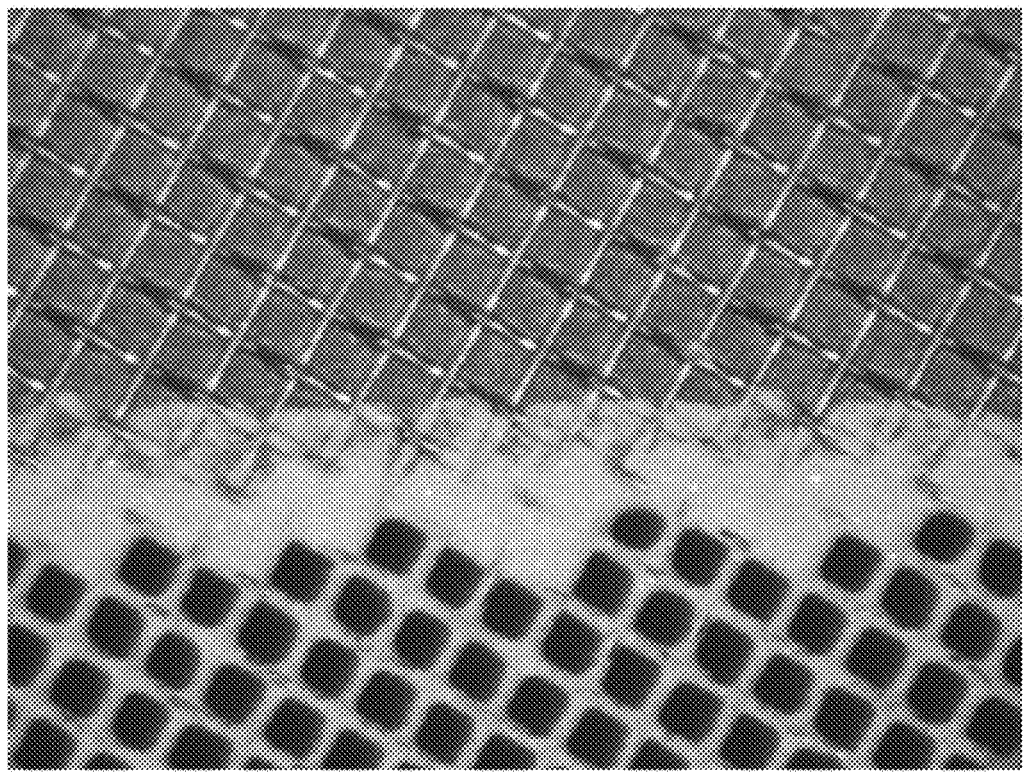
FIG. 12 is a photograph of an emulsion part on the sample surface of Comparative Example 2.

Examples 10 and 11 and Comparative Example were observed with a CCD camera at the emulsion film surface near the printing pattern openings and mesh fibers exposed in the printing pattern openings. The observation results are shown in FIGS. 10 to 12. As shown in FIGS. 10 and 11, no printing paste was adhered to the emulsion on the sample surface of Examples 10 and 11 and the mesh fibers exposed in the printing pattern openings. In contrast, FIG. 12 shows that the printing paste was adhered to the emulsion on the sample surface of Comparative Example 2 and the mesh fibers exposed in the printing pattern openings (this printing paste appears white in the photograph of FIG. 12). Thus, it was confirmed that, in Examples 10 and 11, the fluorine-containing silane coupling agent was tightly fixed on the emulsion film as well as on the mesh via the thin primer film according to an embodiment of the present disclosure.

FIGS. 10 to 12 show, in the lower portions, the mesh fibers exposed in the printing pattern openings. In Comparative Example shown in FIG. 12, the printing paste was adhered to almost the entire surface of the mesh fibers and to part of the mesh openings so as to clog the entirety thereof. That is, Comparative Example 2 indicates poor demoldability of the paste. In contrast, Examples 10 and 11 shown in FIGS. 10 and 11, respectively, indicate that the printing paste remaining on the mesh fibers was scarce, and no mesh opening is clogged with the printing paste. That is, Examples 10 and 11 indicate excellent demoldability of the paste.

Next, the fixity of the fluorine-containing silane coupling agent on the mesh in a screen printing plate was determined by the method described in the following paragraph. The mesh, having a thin primer layer formed thereon by a dry process according to an embodiment of the present disclosure, was affixed on a frame and coated with an emulsion, and was exposed again in the printing pattern openings in the emulsion film formed by exposure development.

First, a stainless steel rectangular meshes (#500-19) with a size of 300 mm by 300 mm was prepared. On the mesh (#500-19) was formed by the following process a primer layer composed of an Si-containing amorphous carbon film according to an embodiment of the present disclosure. First, the prepared mesh (#500-19) was placed into a high-pressure pulsed plasma CVD apparatus, and a reaction container of the CVD apparatus was evacuated to $1 \times 10^{-3}$ Pa. Next, argon gas was introduced into the evacuated CVD apparatus at a flow rate of 30 SCCM and a gas pressure of 2 Pa, and the mesh (#500-19) was cleaned with argon gas plasma at an applied voltage of −4 kV, a pulse frequency of 10 kHz, and a pulse width of 10 µs. Next, after argon gas was discharged, trimethylsilane was introduced into the CVD apparatus at a flow rate of 30 SCCM and a gas pressure of 2 Pa, and a film was formed at an applied voltage of −4 kV, a pulse frequency of 10 kHz, and a pulse width of 10 µs for six min. Through this process, an Si-containing amorphous carbon film was formed on a surface of the mesh (#500-19).

Next, acetylene gas was discharged, and then oxygen gas was introduced into the CVD apparatus at a flow rate of 30 SCCM and a gas pressure of 2 Pa, and the mesh (#500-19) having formed thereon the amorphous carbon film was irradiated with oxygen plasma at an applied voltage of −3 kV, a pulse frequency of 10 kHz, and a pulse width of 10 µs for 3 min. Thus, an amorphous carbon film (a thin film primer layer formed by a dry process) containing silicon and oxygen was obtained.

Next, the mesh having the amorphous carbon film thus formed thereon was attached to an iron casting frame with a size of 450 mm by 450 mm via a polyester mesh. Next, an emulsion was applied to the mesh having the amorphous film formed thereon and attached to the frame. The emulsion was applied to a thickness of 5 µm within a rectangular area having a size of 150 mm by 150 mm in the middle of the mesh. Roughly, the emulsion used was composed mainly of 13% vinyl acetate-based emulsion, 8% polyvinyl alcohol, 14% photopolymerization resin, and 65% water. Next, the emulsion film formed on the mesh was subjected to exposure development by a known photolithography method to form a rectangular printing pattern opening having a size of 30 mm by 30 mm in the rough middle of the rectangular area (150 mm by 150 mm) coated with the emulsion.

Next, a fluorine-containing silane coupling agent was manually applied with an unwoven fabric (BEMCOT CLEAN WIPE-P from Asahi Kasei Corporation) to the portion of the mesh exposed in the printing pattern opening. The fluorine-containing silane coupling agent used was a solution of FG-5010Z130-0.2 from Fluoro Technology Corporation (fluororesin: 0.02 to 0.2%, fluorine-based solvent: 99.8% to 99.98%). Then, the mesh coated with the fluorine-containing silane coupling agent was dried at a room temperature and a humidity of about 50% for 180 minutes. Then, the portion of the mesh exposed in the printing pattern opening was again coated with the same fluorin-containing silane coupling agent in the same manner; and the mesh was dried under the same condition for 180 minutes. Thus, an emulsion screen printing plate was completed.

Next, the mesh coated with the fluorine-containing silane coupling agent was cut off from the complete emulsion screen printing plate with a cutter knife. Then, the mesh cut off was placed into an ultrasonic cleaning apparatus filled with isopropyl alcohol (IPA) and was subjected to ultrasonic cleaning for five minutes. The ultrasonic cleaning removed excess fluorine-containing coupling agent not fixed on the mesh. The ultrasonic cleaning was carried out with an ultrasonic cleaner "US-20KS" from SND Co., Ltd. (oscillation: 38 kHz (bolt-clamped Langevin type transducer (BLT) self-oscillation), high-frequency output 480 W).

Thus prepared mesh coated with the fluorine-containing silane coupling agent was measured for its contact angle with an oil (mineral spirit) at different ten points on the mesh being held in the space. The measurement was carried out with a portable contact angle analyzer "PG-X" (mobile contact angle tester) from FIBRO System AB, at a room temperature of 25° C. and a humidity of 30%. The average of the measured contact angle was 78°, confirming that the subject surface of the mesh had water repellence and oil repellence. Incidentally, the contact angle of an unprocessed stainless steel mesh (#500-19) with an oil (mineral spirit) measured under the same condition as above was about 27°. Thus, it was confirmed that the fluorine-containing silane coupling agent remains fixed on the surface of the mesh even after the ultrasonic cleaning.

As described above, the fluorine-containing coupling agent can be applied with excellent fixity on the mesh having formed thereon a primer layer comprising an amorphous carbon film containing silicon and oxygen in accordance with an embodiment of the present disclosure.

LIST OF REFERENCE NUMBERS

10: Screen printing plate
12: Frame
14: Emulsion
16: Mesh
18: Printing pattern opening
20: Thin coating film
30: Electronic component conveyor
32: Absorbing collet
34: Porous sheet

What is claimed is:

1. A structure comprising: a substrate; an emulsion layer formed on the substrate; and a thin primer film containing at least one substance selected from the group consisting of silicon, titanium, aluminum, aluminum oxide, and zirconium and formed on a part or entirety of a surface of the emulsion layer by a dry process, wherein the substrate is selected from the group consisting of: (a) a stencil printing plate having formed therein openings corresponding to a printing pattern; (b) a mesh body; (c) a mesh body used in a stencil printing plate; (d) a printing pattern retainer of a stencil printing plate, the printing pattern retainer having formed therein printing pattern openings; and (e) a porous sheet body.

2. The structure of claim 1 wherein the thin primer film further contains oxygen or nitrogen.

3. The structure of claim 1 wherein the thin primer film contains an Si oxide, a Ti oxide, or a Zr oxide.

4. The structure of claim 1 wherein the dry process is a process selected from the group consisting of sputtering methods, plasma CVD methods, CVD methods, vacuum evaporation methods, MBE methods, cluster ion beam methods, high-frequency ion plating methods, and combinations of these methods.

5. The structure of claim 1 wherein an amorphous carbon film substantially comprising carbon only or an amorphous carbon film substantially comprising carbon and hydrogen only is formed on an area of the surface of the emulsion layer where the thin primer film is not formed.

6. The structure of claim 1 wherein the substrate is a stencil printing plate having formed therein openings corresponding to a printing pattern.

7. The structure of claim 1 wherein the substrate is a mesh body.

8. The structure of claim 1 wherein the substrate is a mesh body used in a stencil printing plate.

9. The structure of claim 1 wherein the substrate is a printing pattern retainer of a stencil printing plate, the printing pattern retainer having formed therein printing pattern openings.

10. The structure of claim 1 wherein the substrate is a porous sheet body.

11. A stencil printing plate comprising: a printing mesh body; an emulsion layer formed on the printing mesh body; and a thin primer film formed on the emulsion layer by a dry process and containing at least one substance selected from the group consisting of silicon, titanium, aluminum, aluminum oxide, and zirconium; and a coating layer formed on the thin primer film and having water repellence and/or water and oil repellence.

12. The stencil printing plate of claim 11 wherein the thin primer film further contains oxygen or nitrogen.

13. The stencil printing plate of claim 11 wherein the thin primer film contains an Si oxide, a Ti oxide, or a Zr oxide.

14. The stencil printing plate of claim 11 wherein the coating layer comprises a fluorine-containing coupling agent.

15. The stencil printing plate of claim 11 wherein the coating layer comprises a fluorine-containing silane coupling agent.

16. The stencil printing plate of claim 11 wherein the coating later comprises: a first layer formed on the thin primer film and composed mainly of a coupling agent capable of forming, with the thin primer film, a hydrogen bonding and/or an —O-M bonding (M is any one element selected from a group consisting of Si, Ti, Al, and Zr) by condensation reaction; and a second layer formed on the first layer and composed mainly of a water-repellent material or a water- and oil-repellent material.

17. The stencil printing plate of claim 11 wherein the coupling agent is selected from a group consisting of silane coupling agent, titanate-based coupling agent, aluminate-based coupling agent, and zirconate-based coupling agent.

18. A method of producing a stencil printing plate comprising the steps of: preparing a printing mesh body; forming an emulsion layer on the printing mesh body; and forming a thin film containing at least one element or compound selected from the group consisting of silicon, titanium, aluminum, aluminum oxide, and zirconium on the emulsion layer by a dry process.

19. The method of claim 18, further comprising the step of subjecting the thin film to a plasma process with any one of nitrogen, oxygen, and a mixture gas of nitrogen and oxygen.

* * * * *